(12) United States Patent
Sim et al.

(10) Patent No.: US 12,058,866 B2
(45) Date of Patent: Aug. 6, 2024

(54) SEMICONDUCTOR DEVICE AND ELECTRONIC SYSTEM

(71) Applicant: SAMSUNG ELECTRONICS CO., LTD., Suwon-si (KR)

(72) Inventors: Jaeryong Sim, Suwon-si (KR); Shinhwan Kang, Suwon-si (KR); Jeehoon Han, Hwaseong-si (KR)

(73) Assignee: Samsung Electronics Co., Ltd. (KR)

( * ) Notice: Subject to any disclaimer, the term of this patent is extended or adjusted under 35 U.S.C. 154(b) by 530 days.

(21) Appl. No.: 17/204,248

(22) Filed: Mar. 17, 2021

(65) Prior Publication Data

US 2022/0045083 A1 Feb. 10, 2022

(30) Foreign Application Priority Data

Aug. 10, 2020 (KR) .................. 10-2020-0100116

(51) Int. Cl.
| | |
|---|---|
| H01L 29/76 | (2006.01) |
| H01L 23/48 | (2006.01) |
| H01L 29/94 | (2006.01) |
| H01L 31/062 | (2012.01) |
| H10B 43/27 | (2023.01) |
| H10B 43/50 | (2023.01) |

(52) U.S. Cl.
CPC .......... *H10B 43/50* (2023.02); *H01L 23/481* (2013.01); *H10B 43/27* (2023.02)

(58) Field of Classification Search
CPC . H01L 29/66833; H01L 29/792; H10B 43/50; H10B 43/27; H10B 43/40; H10B 43/20; H10B 43/35; H10B 43/10; H10B 43/00; H10B 43/30
See application file for complete search history.

(56) References Cited

U.S. PATENT DOCUMENTS

| | | |
|---|---|---|
| 8,278,699 B2 | 10/2012 | Tanaka et al. |
| 8,338,882 B2 | 12/2012 | Tanaka et al. |

(Continued)

*Primary Examiner* — Mary A Wilczewski
*Assistant Examiner* — Tsz K Chiu
(74) *Attorney, Agent, or Firm* — Fish & Richardson P.C.

(57) ABSTRACT

A semiconductor device includes a lower structure including a peripheral circuit, a lower insulating structure covering the peripheral circuit, and a pattern structure on the lower insulating structure; a stack structure including interlayer insulating layers and horizontal layers alternately stacked on the lower structure, wherein the horizontal layers include gate horizontal layers in a gate region of the stack structure and first insulating horizontal layers in a first insulating region of the stack structure; a memory vertical structure including a portion penetrating the gate horizontal layers; dummy vertical structures including a portion penetrating the gate horizontal layers; a first peripheral contact plug including a portion penetrating the first insulating region; and gate contact plugs on gate pads of the gate horizontal layers, wherein upper surface of the gate contact plugs and the first peripheral contact plugs are coplanar with each other, wherein the memory vertical structure and the dummy vertical structure are contacting the pattern structure, and wherein at least one of the dummy vertical structures extend further into the pattern structure than the memory vertical structure in a downward direction.

18 Claims, 36 Drawing Sheets

(56) References Cited

U.S. PATENT DOCUMENTS

| | | | | |
|---|---|---|---|---|
| 8,982,622 B2 * | 3/2015 | Hung | ................. | G11C 16/04 |
| | | | | 365/185.11 |
| 9,524,975 B2 | 12/2016 | Eom | | |
| 9,842,855 B2 | 12/2017 | Lee | | |
| 9,985,048 B2 | 5/2018 | Lee | | |
| 10,475,806 B2 | 11/2019 | Yagi et al. | | |
| 11,121,143 B2 * | 9/2021 | Luo | ................. | G11C 16/0483 |
| 11,211,391 B2 * | 12/2021 | Yun | ................. | H10B 43/27 |
| 11,664,281 B2 * | 5/2023 | Moon | ................. | H01L 29/1037 |
| | | | | 257/329 |
| 2017/0373084 A1 * | 12/2017 | Shim | ................. | H10B 43/27 |
| 2018/0047744 A1 * | 2/2018 | Utsumi | ................. | H01L 24/16 |
| 2019/0006381 A1 * | 1/2019 | Nakatsuji | ................. | H10B 43/10 |
| 2020/0027893 A1 | 1/2020 | Yang et al. | | |
| 2020/0035694 A1 | 1/2020 | Kaminaga | | |
| 2020/0373316 A1 * | 11/2020 | Luo | ................. | H10B 43/40 |
| 2021/0082941 A1 * | 3/2021 | Son | ................. | H01L 23/528 |
| 2021/0343737 A1 * | 11/2021 | Utsumi | ................. | G11C 5/04 |

* cited by examiner

SEMICONDUCTOR DEVICE AND ELECTRONIC SYSTEM

CROSS-REFERENCE TO RELATED APPLICATION(S)

This application claims the benefit of Korean Patent Application No. 10-2020-0100116 filed on Aug. 10, 2020 in the Korean Intellectual Property Office, the subject matter of which is hereby incorporated by reference.

BACKGROUND

Embodiments of the present disclosure relate to semiconductor devices and electronic systems including same.

Contemporary and emerging electronic devices continue a demand for semiconductor devices capable of storing high-capacity data. Accordingly, various technologies and approaches directed to increasing the data storage capacity of semiconductor devices have been investigated. In one approach, semiconductor devices arrange constituent memory cells three-dimensionally instead of two-dimensionally.

SUMMARY

Embodiments of the present disclosure provide semiconductor devices having greater data storage capacity, denser integration density and greater reliability. Other embodiments of the present disclosure provide electronic systems including such semiconductor device(s).

According to an embodiment of the present disclosure, a semiconductor device includes; a lower structure including a peripheral circuit, a lower insulating structure covering the peripheral circuit, and a pattern structure on the lower insulating structure, a stack structure including interlayer insulating layers and horizontal layers alternately stacked on the lower structure, wherein the horizontal layers include gate horizontal layers disposed in a gate region of the stack structure and first insulating horizontal layers disposed in a first insulating region of the stack structure, a memory vertical structure including a portion penetrating the gate horizontal layers in a vertical direction, dummy vertical structures including a portion penetrating the gate horizontal layers in the vertical direction and spaced apart from the memory vertical structure, a first peripheral contact plug including a portion penetrating the first insulating region in the vertical direction and gate contact plugs disposed on gate pads of the gate horizontal layers. The gate contact plugs and the first peripheral contact plugs have upper surfaces disposed at the same level, the memory vertical structure includes a first material different from a material of the dummy vertical structures, the memory vertical structure and the dummy vertical structure contact the pattern structure, and at least one of the dummy vertical structures extends further downwardly into the pattern structure than the memory vertical structure from the upper surface of the pattern structure.

According to an embodiment of the present disclosure, a semiconductor device includes; a lower structure including a peripheral circuit and a pad pattern electrically connected to the peripheral circuit, a stack structure including interlayer insulating layers and horizontal layers alternately stacked on the lower structure, where the stack structure extends from a memory cell array region to a staircase region adjacent to the memory cell array region, the stack structure includes a gate region and an insulating region, and a side surface of the insulating region is at least partially surrounded by the gate region in the staircase region, and the horizontal layers include gate horizontal layers disposed in the gate region and insulating horizontal layers disposed in the insulating region, a memory vertical structure including a portion penetrating the gate horizontal layers in a vertical direction in the memory cell array region, dummy vertical structures including a portion penetrating the gate horizontal layers in the vertical direction in the staircase region, a peripheral contact plug contacting the pad pattern, extending in the vertical direction, and penetrating the insulating region, and gate contact plugs disposed on the gate pads of the gate horizontal layers in the staircase region. The gate contact plugs and the peripheral contact plugs have upper surfaces disposed at the same level, the stack structure includes a first staircase region and a second staircase region arranged in a first direction away from the memory cell array region, and a staircase connection region disposed between the first staircase region and the second staircase region in the staircase region, each of the first and second staircase regions includes a staircase shape extending downwardly by a first height difference in the first direction, an upper surface of the staircase connection region has a shape that is at least one of flattened in the first direction, and having a height difference less than the first height difference in the first direction, a portion of the staircase connection region is an insulating region, and the memory vertical structure includes a material different from a material of the dummy vertical structures.

According to an embodiment of the present disclosure, an electronic system includes; a main substrate, a semiconductor device on the main substrate, and a controller electrically connected to the semiconductor device on the main substrate. The semiconductor device includes; a lower structure including a peripheral circuit, a lower insulating structure covering the peripheral circuit, and a pattern structure on the lower insulating structure, a stack structure including interlayer insulating layers and horizontal layers alternately stacked on the lower structure, wherein the horizontal layers include gate horizontal layers disposed in the gate region of the stack structure and insulating horizontal layers disposed in the insulating region of the stack structure, a memory vertical structure including a portion penetrating the gate horizontal layers in a vertical direction, dummy vertical structures including a portion penetrating the gate horizontal layers in the vertical direction and spaced apart from the memory vertical structure, a peripheral contact plug including a portion penetrating the insulating region in the vertical direction, and gate contact plugs disposed on gate pads of the gate horizontal layers. The gate contact plugs and the peripheral contact plugs have upper surfaces disposed at the same level, each of the dummy vertical structures has a width greater than a width of each of the memory vertical structures at the same level, the memory vertical structure includes a material different from a material of the dummy vertical structures, the memory vertical structure and the dummy vertical structure extend downwardly from an upper surface of the pattern structure into the pattern structure to contact the pattern structure, and at least one of the dummy vertical structures extends downwardly further into the pattern structure than the memory vertical structure from the upper surface of the pattern structure.

BRIEF DESCRIPTION OF DRAWINGS

The above and other aspects, features, and advantages of the present disclosure may be more clearly understood upon consideration of the following detailed description together with the accompanying drawings, in which.

DETAILED DESCRIPTION

Hereinafter, embodiments of the present disclosure will be described with reference to the accompanying drawings. Throughout the written description and drawings, like reference numbers and labels are used to denote like or similar elements and/or features. Throughout the written description certain geometric terms may be used to highlight relative relationships between elements, components and/or features with respect to certain embodiments of the inventive concept. Those skilled in the art will recognize that such geometric terms are relative in nature, arbitrary in descriptive relationship(s) and/or directed to aspect(s) of the illustrated embodiments. Geometric terms may include, for example: height/width; vertical/horizontal; top/bottom; higher/lower; closer/farther; thicker/thinner; proximate/distant; above/below; under/over; upper/lower; center/side; surrounding; overlay/underlay; etc.

Figure 1:
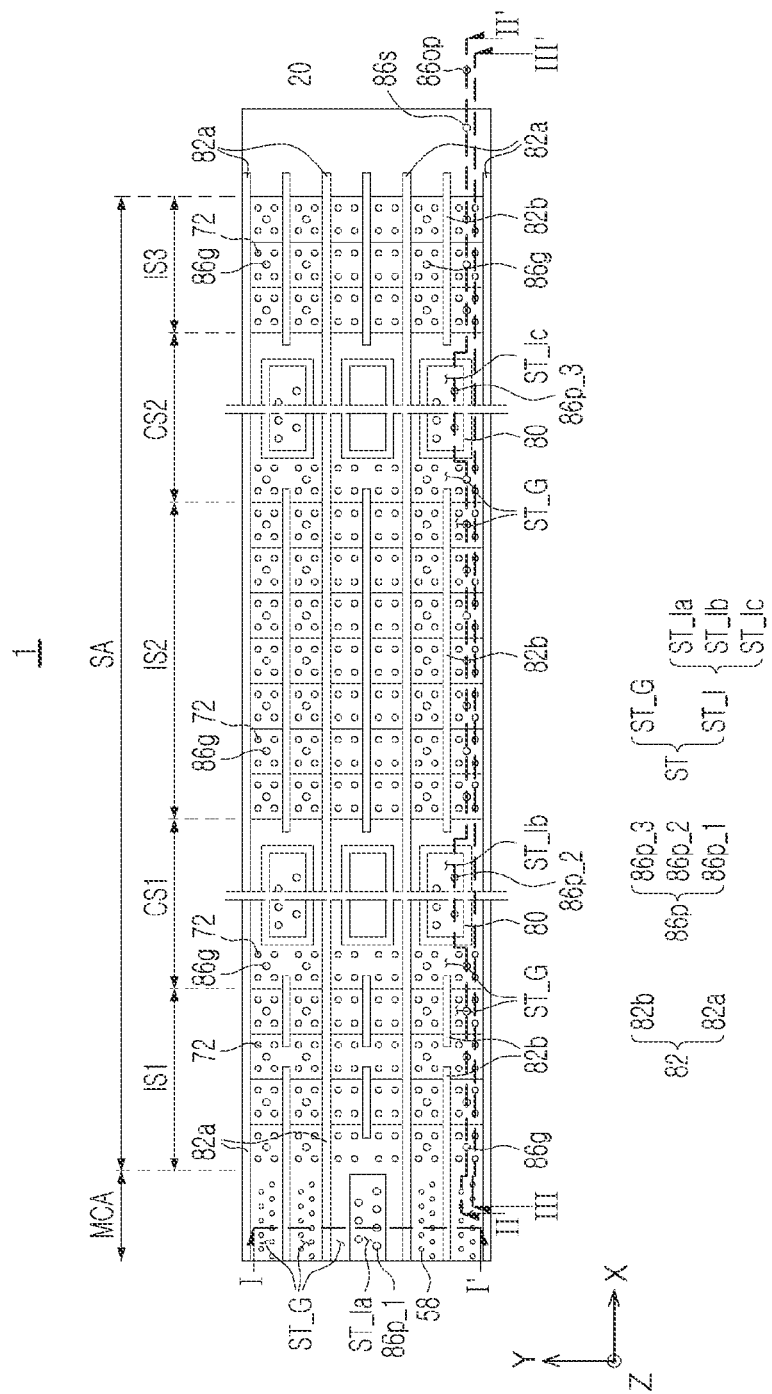
FIG. 1 is a plan (or top down view) diagram illustrating a semiconductor device according to embodiments of the present disclosure.
Figure 2A:
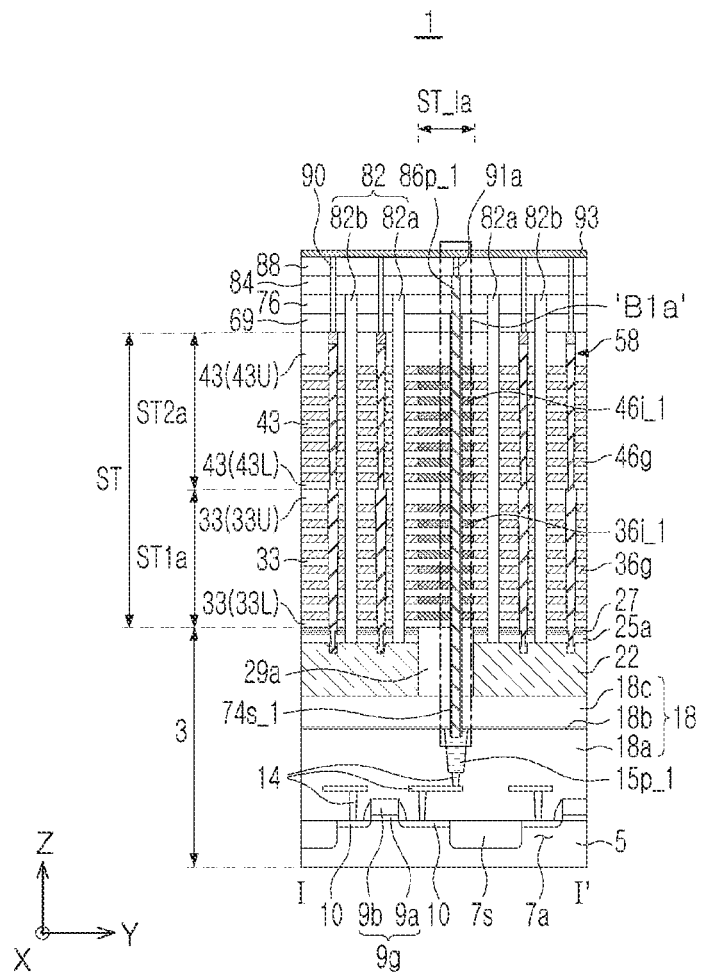
FIGS. 2A, 2B, 2C, 3A, 3B, 3C, 4A, 4B, 4C, 5, 6A, 6B, 7A, 7B, 8, 9A, 9B, 10A, 10B, 10C, 11A, 11B, 11C, 12A, 12B, 13, 14A, 14B, 14C are respective cross-sectional diagrams variously illustrating portion(s) of semiconductor devices according to embodiments of the present disclosure.
Figure 2B:
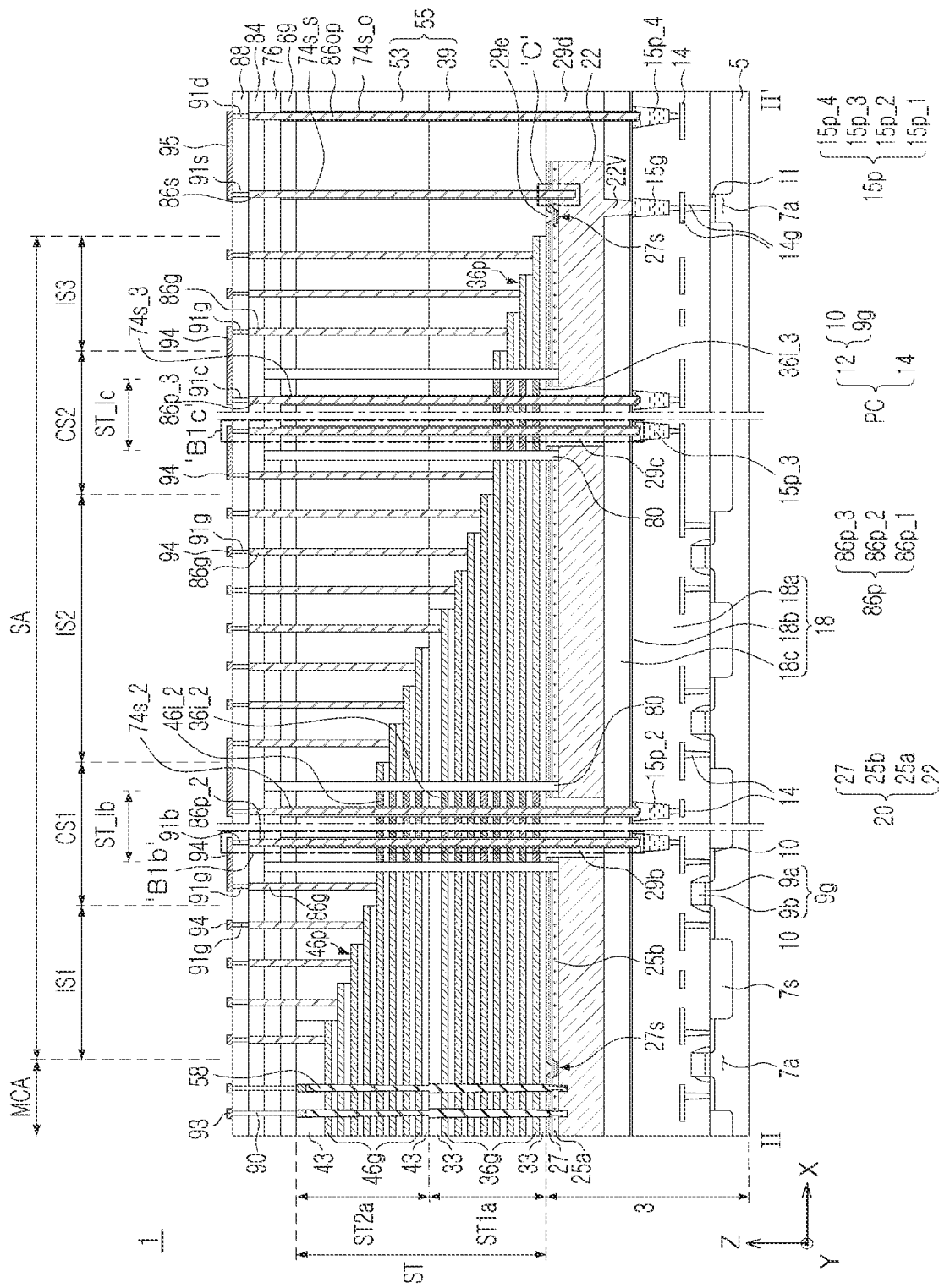
Figure 2C:
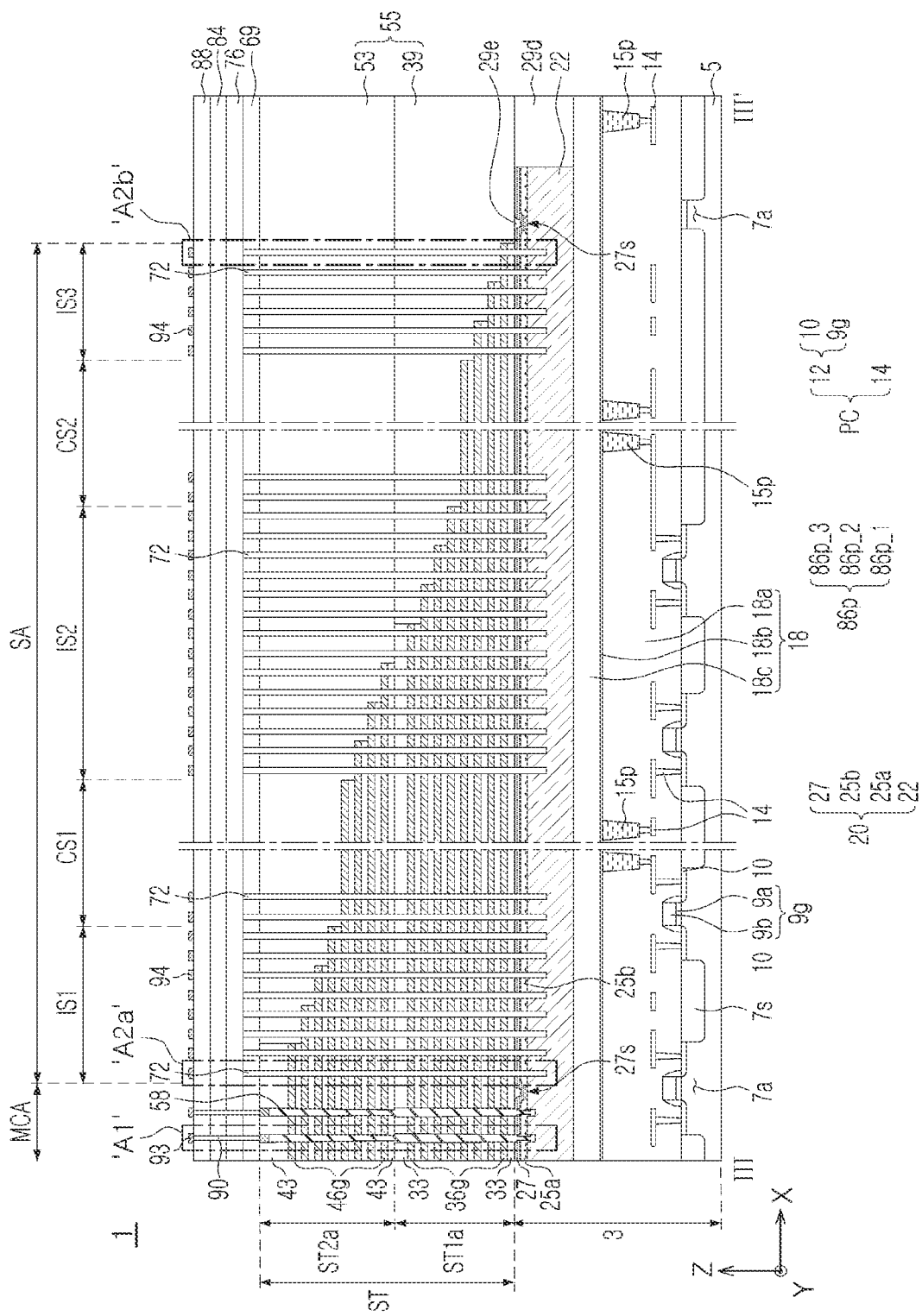

A semiconductor device according to embodiments of the present disclosure will be described in relation to FIGS. 1, 2A, 2B, and 2C, wherein FIG. 1 is a plan view illustrating a semiconductor device 1, FIG. 2A is a cross-sectional diagram taken along line I-I' of FIG. 1, FIG. 2B is a cross-sectional diagram taken along line II-II' of FIG. 1, and FIG. 2C is a cross-sectional diagram taken along line III-III' of FIG. 1.

Referring collectively to FIGS. 1, 2A, 2B, and 2C, the semiconductor device 1 may include a lower structure 3, a stack structure ST, a capping insulating structure 55, memory vertical structures 58, dummy vertical structures 72, separation structures 82, peripheral contact plugs 86$p$ and gate contact plugs 86$g$.

The semiconductor device 1 may further include a pattern structure 20, as well as a bit line 93, gate connection wirings 94 and a source connection wiring 95.

The semiconductor device 1 may further include a bit line connection pattern 90, a gate connection pattern 91, peripheral contact connection patterns 91$a$, 91$b$, and 91$c$, a source contact connection pattern 91$s$, and an outer peripheral contact connection pattern 91$d$.

In some embodiments, the lower structure 3 may include a semiconductor substrate 5, a peripheral circuit PC on the semiconductor substrate 5, and a lower insulating structure 18 covering the peripheral circuit PC on the semiconductor substrate 5. Here, the peripheral circuit PC may include a peripheral device 12 disposed on the semiconductor substrate 5 and a peripheral wiring structure 14 electrically connected to the peripheral device 12 on the semiconductor substrate 5.

The peripheral device 12 may include a transistor including a peripheral source/drain 10 and a peripheral gate 9$g$. For example, the peripheral gate 9$g$ may be disposed on the active region 7$a$ defined by a device isolation layer 7$s$ on the semiconductor substrate 5, and the peripheral source/drain 10 may be disposed in the active region 7$a$ on both sides of the peripheral gate 9$g$. The peripheral gate 9$g$ may include a peripheral gate dielectric layer 9$a$ and a peripheral gate electrode 9$b$ stacked in order. The peripheral wiring structure 14 may include conductor layers extending in a vertical direction (e.g., a third or Z direction) as well as horizontal directions (e.g., a first or X direction and a second or Y direction).

In some embodiments, the lower structure 3 may further include peripheral pad patterns 15$p$ electrically connected to the peripheral wiring structure 14 on the peripheral wiring structure 14. Each of the peripheral pad patterns 15$p$ may have a thickness (e.g., measured in the vertical direction relative to the horizontal orientation of the semiconductor substrate 5) greater than a thickness of the gate electrode 9$b$. The peripheral pad patterns 15$p$ may include a metal material such as tungsten. The peripheral pad patterns 15$p$ may include a first peripheral pad pattern 15$p$_1, a second peripheral pad pattern 15$p$_2, a third peripheral pad pattern 15$p$_3, and an outer peripheral pad pattern 15$p$_4.

The lower insulating structure 18 may include a first lower insulating layer 18$a$ covering the peripheral wiring structure 14 on the semiconductor substrate 5 and at least partially surrounding side surfaces of the peripheral pad patterns 15$p$, an etch stop layer 18$b$ on the first lower insulating layer 18$a$ and the peripheral pad patterns 15$p$, and a second lower insulating layer 18$c$ on the etch stop layer 18$b$.

The etch stop layer 18$b$ may be formed of a material different from a material of the first and third lower insulating layers 18$a$ and 18$c$ adjacent to the etch stop layer 18$b$. For example, the etch stop layer 18$b$ may be formed of silicon nitride or a high-k dielectric material, and the first and third lower insulating layers 18$a$ and 18$c$ adjacent to the etch stop layer 18$b$ may be formed of silicon oxide or a low-k dielectric material.

In some embodiments, the lower structure 3 may further include a pattern structure 20.

For example, the pattern structure 20 may include a lower pattern layer 22, a first intermediate pattern layer 25$a$ and a second intermediate pattern layer 25$b$ spaced apart from each other on the lower pattern layer 22, an upper pattern layer 27 covering the first and second intermediate pattern layers 25$a$ and 25$b$ on the lower pattern layer 16.

In this regard, the lower pattern layer 22 may include a first polysilicon, the first intermediate pattern layer 25$a$ may include a second polysilicon, and the upper pattern layer 27 may include a third polysilicon. For example, the lower pattern layer 22, the first intermediate pattern layer 25$a$, and the upper pattern layer 27 may include polysilicon having an N-type conductivity.

In an example, the upper pattern layer 27 may contact the lower pattern layer 22 between the first and second intermediate pattern layers 25$a$ and 25$b$, may partially penetrate the second intermediate pattern layer 25$b$, and may contact the lower pattern layer 22. Portions in which the upper pattern layer 27 and the lower pattern layer 22 contacting each other may be referred to as support portions 27s.

The second intermediate pattern layer 25b may include an insulating material.

In some embodiments, the lower structure 3 may further include a ground structure. Here, the ground structure may include a ground impurity region 11 formed in the active region 7a of the semiconductor substrate 5, a ground wiring structure 14g electrically connected to the ground impurity region 11 on the ground impurity region 11, a ground pad pattern 15g electrically connected to the ground wiring structure 14g on the ground wiring structure 14g, and a ground pattern 22V extending from a lower portion of the lower pattern layer 22 and electrically connected to the ground pad pattern 15g. The ground impurity region 11 may have N-type conductivity. The ground pad pattern 15g may be formed of the same material as that of the peripheral pad patterns 15p on the same level as that of the peripheral pad patterns 15p.

In some embodiments, the lower structure 3 may further include a first gap-fill insulating layer 29a, a second gap-fill insulating layer 29b, and a third gap-fill insulating layer 29c, penetrating the pattern structure 20.

For example, the lower structure 3 may further include an outer insulating layer 29d surrounding an outer surface of the pattern structure 20. The lower structure 3 may further include an insulating layer 29e filling a concave portion of an upper surface of the pattern structure 20. For example, the insulating layer may fill a concave portion of an upper surface of the support portion 27s.

The stack structure ST may extend from the memory cell array region MCA to a stair-stepped (or staircase) region SA adjacent to the memory cell array region MCA on the lower structure 3.

That is, the stack structure ST may be formed in a staircase shape within the staircase region SA. For example, in the staircase region SA, the stack structure ST may include an upper staircase region IS1, a first staircase connection region CS1, an intermediate stair region IS2, a second staircase connection region CS2, and a lower staircase region IS3, arranged in the first direction (e.g., the X direction) away from the memory cell array region MCA.

In the stack structure ST, each of the upper, intermediate and lower staircase regions IS1, IS2, and IS3 may have a staircase shape decreasing in the first direction, and the upper surface of each of the first and second staircase connection regions CS1 and CS2 may have a substantially flattened shape in the first direction or may have a shape in which a height difference thereof may be less than a height difference of the staircases of the upper, intermediate and lower staircase regions IS1, IS2, and IS3.

The stack structure ST may include a gate region ST_G and an insulating region ST_I. In the stack structure ST, the insulating region ST_I may include a first insulating region ST_Ia adjacent to the memory cell array region MCA, a second insulating region ST_Ib disposed in the first staircase connection region CS1, and a second insulating region ST_Ic disposed in the second staircase connection region CS2, in the second direction (e.g., a Y direction substantially perpendicular to the first direction). In the stack structure ST, the gate region ST_G may be a region other than the insulating region ST_I. Accordingly, the insulating region ST_1 may be at least partially surrounded by the gate region ST_G.

In some embodiments, the stack structure ST may include interlayer insulating layers 33 and 43 and horizontal layers 48 alternately stacked on the lower structure 3. The horizontal layers 48 may include gate horizontal layers 36g and 46g and insulating horizontal layers 36i and 46i. The gate horizontal layers 36g and 46g may include a conductive material, and the insulating horizontal layers 36i and 46i may be formed of an insulating material such as silicon oxide.

The gate horizontal layers 36g and 46g may be disposed within the gate region ST_G, and the insulating horizontal layers 36i and 46i may be disposed within the insulating region ST_I.

For example, the stack structure ST may include a lower stack structure ST1a and an upper stack structure ST2a on the lower stack structure ST1a.

The lower stack structure ST1a may include lower interlayer insulating layers 33 and lower horizontal layers 36 alternately stacked. An uppermost layers of the lower interlayer insulating layers 33 and the lower horizontal layers 36 may be an uppermost lower interlayer insulating layer 33U, and a lowermost layer may be a lowermost lower interlayer insulating layer 33L. The uppermost lower interlayer insulating layer 33U of the lower interlayer insulating layers 33 may have a thickness greater than a thickness of each of the other lower interlayer insulating layers. The lower horizontal layers 36 may include lower gate horizontal layers 36g and lower insulating horizontal layers 36i.

The lower insulating horizontal layers 36i may include first lower insulating horizontal layers 36i_1 in the first insulating region ST_Ia, second lower insulating horizontal layers 36i_2 in the second insulating region ST_Ib, and third lower insulating horizontal layers 36i_3 in the third insulating region ST_Ic.

The upper stack structure ST2a may include upper interlayer insulating layers 43 and lower horizontal layers 46 alternately stacked. An uppermost layer of the upper interlayer insulating layers 43 and the lower horizontal layers 36 may be an uppermost upper interlayer insulating layer 43U, and a lowermost layer may be a lowermost upper interlayer insulating layer 43L. The uppermost upper interlayer insulating layer 43U of the upper interlayer insulating layers 43 may have a thickness greater than a thickness of each of the other upper interlayer insulating layers. The upper horizontal layers 46 may include upper gate horizontal layers 46g and upper insulating horizontal layers 46i.

The upper insulating horizontal layers 46i may include first upper insulating horizontal layers 46i_1 in the first insulating region ST_Ia, and second upper insulating horizontal layers 46i_2 in the second insulating region ST_Ib.

The interlayer insulating layers 33 and 43 may include the lower interlayer insulating layers 33 and the upper interlayer insulating layers 43. The horizontal layers 48 may include the lower horizontal layers 36 and the upper horizontal layers 46.

The semiconductor device 1 may further include a capping insulating structure 55 covering a portion of the stack structure ST on the lower structure 3. The capping insulating structure 55 may have an upper surface coplanar with an upper surface of the stack structure ST and may cover a staircase-shaped portion of the stack structure ST. The capping insulating structure 55 may include a lower capping insulating layer 39 covering a staircase-shaped portion, and an upper capping insulating layer 53 covering a staircase-shaped portion of the upper stack structure ST2a on the lower capping insulating layer 39.

The memory vertical structure 58 may penetrate the gate region ST_G of the stack structure ST in the memory cell array region MCA. The memory vertical structure 58 may contact the pattern structure 20.

The semiconductor device 1 may further include vertically stacked first, second, third and fourth upper insulating layers 69, 76, 84, and 88.

The dummy vertical structures 72 may penetrate the gate region ST_G of the stack structure ST and may extend in the vertical direction in the staircase region SA, and may penetrate the upper insulating layer 69. At least one of the dummy vertical structures 72 may penetrate the capping insulating structure 55 disposed between the first upper insulating layer 69 and the stack structure ST.

For example, the dummy vertical structures 72 may include silicon oxide or a low-k dielectric layer.

The separation structures 82 may penetrate the stack structure ST and may extend in the vertical direction. The separation structures 82 may extend in the vertical direction from a portion penetrating the stack structure ST and may penetrate the second upper insulating layer 76.

The separation structures 82 may include main separation structures 82a isolating and spacing the stack structures ST in the second direction, and auxiliary separation structures 82b each having a length less than a length of each of the main separation structures 82a between the main separation structures 82a. The separation structures 82 may include silicon oxide.

The semiconductor device 1 may further include a dam structure 80 surrounding each of the second and third insulating regions ST_Ib and ST_Ic. In an example, the dam structure 80 may include a material different from a material of the separation structures 82. For example, the dam structure 80 may include a material different from the material of the separation structures 82, at least one of polysilicon and silicon nitride, for example.

The peripheral contact plugs 86p may have upper surfaces disposed on substantially the same level. Each of the peripheral contact plugs 86p may include a portion penetrating the first, second and third upper insulating layers 69, 76, and 84 and extending downwardly to penetrate the insulating region ST_I. For example, the peripheral contact plugs 86p may include a first peripheral contact plug 86p_1 including a portion penetrating the first insulating region ST_Ia in the vertical direction, a second peripheral contact plug 86p_b including a portion penetrating the second insulating region ST_Ib in the vertical direction, and a third peripheral contact plug 86p_3 including a portion penetrating the third insulating region ST_Ic in the vertical direction.

The first peripheral contact plug 86p_1 may penetrate the first gap-fill insulating layer 29a disposed in a lower portion of the first insulating region ST_Ia and may extend downwardly to contact the first pad pattern 15p_1. The second peripheral contact plug 86p_2 may penetrate the second gap-fill insulating layer 29b disposed in a lower portion of the second insulating region ST_Ib and may extend downwardly to contact the second pad pattern 15p_2. The third peripheral contact plug 86p_3 may penetrate the third gap-fill insulating layer 29c disposed in a lower portion of the third insulating region ST_Ic and may extend downwardly to contact the third pad pattern 15p_3.

The semiconductor device 1 may further include a source contact plug 86s penetrating the first, second and third upper insulating layers 69, 76, and 84 and the capping insulating structure 55 from an external side of the pattern structure 20, extending downwardly, penetrating the outer peripheral contact plug 86op to contact the outer pad pattern 15p_4, the first, second and third upper insulating layers 69, 76, and 84, and the capping insulating structure 55 extending into the pattern structure 20 to contact the lower pattern layer 22 of the pattern structure 20.

The peripheral contact plugs 86p, the source contact plug 86s, and the outer peripheral contact plug 86op may have upper surfaces disposed on substantially the same level.

The gate contact plugs 86g may contact and be electrically connected to the lower gate pads 36p of the lower gate horizontal layers 36g and the upper gate pads 46p of the upper gate horizontal layers 46g. The gate contact plugs 86g, the peripheral contact plugs 86p, the source contact plug 86s, and the outer peripheral contact plug 86op may include the same conductive material. The gate contact plugs 86g, the peripheral contact plugs 86p, the source contact plug 86s, and the outer peripheral contact plug 86op may have upper surfaces disposed on substantially the same level.

The semiconductor device 1 may include contact spacer layers 74s_1, 74s_2, 74s_3, 74s_s, and 74s_o covering a portion of side surfaces of each of the peripheral contact plugs 86p, the source contact plug 86s, and the outer peripheral contact plug 86op. For example, the contact spacer layers 74s_1, 74s_2, 74s_3, 74s_s, and 74s_o may include a first peripheral contact spacer layer 74s_1 covering a portion of a side surface of the first peripheral contact plug 86p_1, the second peripheral contact spacer layer 74s_2 covering a portion of the side surface of the second peripheral contact plug 86p_2, the third peripheral contact spacer layer 74s_3 covering a portion of the side surface of the third peripheral contact plug 86p_3, the source contact spacer layer 74s_s covering a portion of the side surface of the source contact plug 86s, and the outer peripheral contact spacer layer 74s_o covering a portion of the side surface of the outer peripheral contact plug 86op. Upper ends of the contact spacer layers 74s_1, 74s_2, 74s_3, 74s_s, and 74s_o may be disposed at the same level. The contact spacer layers 74s_1, 74s_2, 74s_3, 74s_s, and 74s_o may be referred to as insulating contact spacer layers.

The semiconductor device 1 may further include bit lines 93, gate connection wirings 94, and source connection wirings 95. In an example, the bit lines 93, the gate connection wirings 94, and the source connection wiring 95 may be disposed on the fourth upper insulating layer 88.

The semiconductor device 1 may include bit line connection patterns 90, gate connection patterns 91g, first peripheral contact connection patterns 91a, second peripheral contact connection patterns 91b, a third peripheral contact connection pattern 91c, a source contact connection pattern 91s, and an outer contact connection pattern 91d.

The bit line connection patterns 90 may electrically connect the bit lines 93 to the memory vertical structure 58 between the bit lines 93 and the memory vertical structure 58. The gate connection patterns 91g may electrically connect the gate connection wirings 94 to the gate contact plugs 86g between the gate connection patterns 94 and the gate contact plugs 86g.

The first peripheral contact connection pattern 91a may electrically connect the first peripheral contact plug 86p_1 to the bit line 93 between the first peripheral contact plug 86p_1 and the bit line 93. The second and third peripheral contact connection patterns 91b and 91c may electrically connect the second and third peripheral contact plugs 86p_2 to 86p_3 to the gate connection wirings 94 between the second and third peripheral contact plugs 86p_2 to 86p_3 and the gate connection wirings 94.

The source contact connection pattern 91s may electrically connect the source contact plug 86s to the source connection wiring 95, and the outer contact connection pattern 91d may electrically connect the outer peripheral contact plug 86op to the source connection wiring 95.

In the written description that follows, various examples and modifications (e.g., modified examples) of the foregoing will be described with continued reference to the embodiments illustrated in FIGS. 1, 2A, 2B and 2C.

Figure 3A:
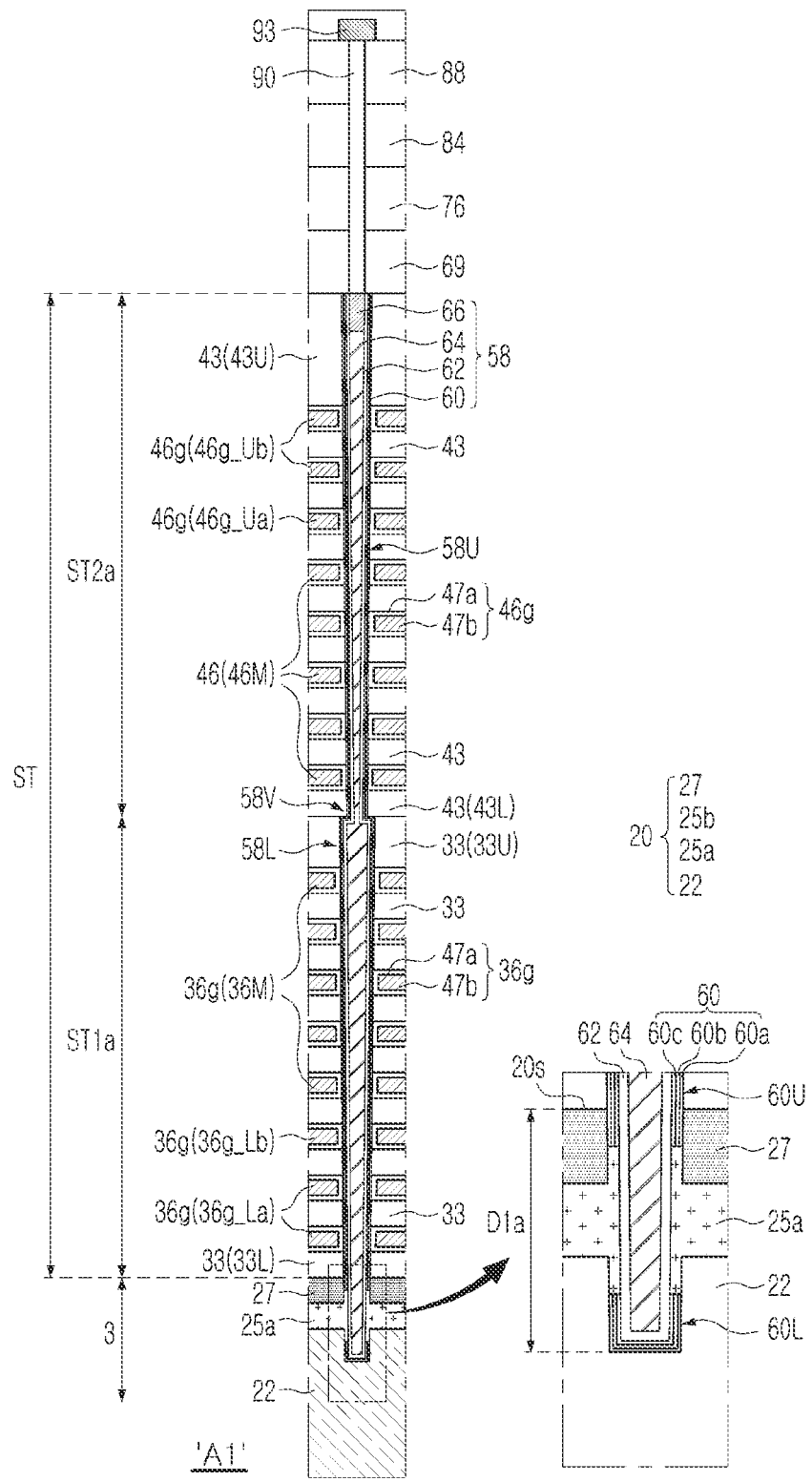

Further, an example of the gate horizontal layers 36g and 46g and the memory vertical structure 58 will be described with reference to FIG. 3A, wherein FIG. 3A is an enlarged cross-sectional diagram illustrating the portion "A1" identified in FIG. 2C.

Referring to FIG. 3A, each of the gate horizontal layers 36g and 46g may include a first gate layer 47a and a second gate layer 47b. The first gate layer 47a may cover upper and lower surfaces of the second gate layer 47b and may be interposed between the second gate layer 47b and the memory vertical structure 58.

For example, the first gate layer 47a may include a dielectric material, and the second gate layer 47b may include a conductive material. For example, the first gate layer 47a may include a high-k dielectric such as AlO, and the second gate layer 47b may include a conductive material such as TiN, WN, Ti, or W.

In other examples, the first gate layer 47a may include a first conductive material (e.g., TiN or W), and the second gate layer 47b may include a second conductive material different from the first conductive material (e.g., Ti or W).

In still other examples, each of the first and second gate layers 47a and 47b may be formed of a doped polysilicon, a metal-semiconductor compound (e.g., TiSi, TaSi, CoSi, NiSi or WSi), a metal nitride (e.g., TiN, TaN or WN) or a metal (e.g., Ti or W).

In some embodiments, the lowermost first lower gate horizontal layer 33g_La of the gate horizontal layers 36g and 46g may be lower erase control gate electrodes, and the first lower gate horizontal layer 33g_La on the second lower gate horizontal layer 33g_Lb may be a ground select gate electrode. A first upper gate horizontal layer 46g_Ua of the gate horizontal layers 36g and 46g may be a string select gate electrode, and a second upper gate horizontal layer 46g_Ub on the first upper gate horizontal layer 46g_Ua may be an upper erase control gate electrode. Each of the first lower gate horizontal layer 33g_La and the second upper gate horizontal layer 46g_Ub may include one or more vertically stacked layers (Z).

In an example, at least a portion of intermediate gate horizontal layers 36M and 46M of the gate horizontal layers 36g and 46g, disposed between the second lower gate horizontal layer 36g_Lb and the first upper gate horizontal layer 46g_Ua, may be word lines.

The memory vertical structure 58 may include an insulating core pattern 64, a channel layer 62 covering a side surface and a bottom surface of the insulating core pattern 64, a data storage structure 60 disposed on an outer surface and a bottom surface of the channel layer 62, and a pad pattern 66 contacting the channel layer 62 on the insulating core pattern 64.

The insulating core pattern 64 may include silicon oxide. The channel layer 62 may include polysilicon. The pad pattern 66 may include at least one of a doped polysilicon, a metal nitride (e.g., TiN, or the like), a metal (e.g., W or the like), and a metal-semiconductor compound (e.g., TiSi or the like).

The data storage structure 60 may include a first dielectric layer 60a, a second dielectric layer 60c, and a data storage layer 60b disposed between the first dielectric layer 60a and the second dielectric layer 60c. The second dielectric layer 60c may contact the channel layer 62, and the data storage layer 60b may be spaced apart from the channel layer 62.

The first dielectric layer 60a may include silicon oxide or silicon oxide doped with impurities. The second dielectric layer 60c may include at least one of silicon oxide and a high-k material. The data storage layer 60b may include regions which may store data in the semiconductor device such as a flash memory device. For example, the data storage layer 60b may include a material for trapping a charge, such as silicon nitride, for example.

The first intermediate pattern layer 25a may penetrate the data storage structure 60 to contact the channel layer 62. Accordingly, the data storage structure 60 may be divided into a lower portion 60L and an upper portion 60U by the first intermediate pattern layer 25a.

A side surface of the memory vertical structure 58 may have an inflection portion 58V in a region in which the upper stack structure ST1a and the lower stack structure ST1a are adjacent to each other. For example, the memory vertical structure 58 may include a lower vertical portion 58L disposed in the lower stack structure ST1a and an upper vertical portion 58U disposed in the upper stack structure ST2a. A width of the lower region of the upper vertical portion 58U may be less than a width of the upper region of the lower vertical portion 58L. Due to this difference in widths, a side surface of the memory vertical structure 58 may have a bent portion, the inflection portion 58V, in a region in which the upper vertical portion 58U and the lower vertical portion 58L are adjacent to each other.

In an example, the memory vertical structure 58 may extend from the upper surface 20s of the pattern structure 20 into the pattern structure 20 by a first depth D1a. Accordingly, the memory vertical structure 58 may penetrate the upper pattern layer 27 and the first intermediate pattern layer 25a in order and may extend into the lower pattern layer 22.

Figure 3B:
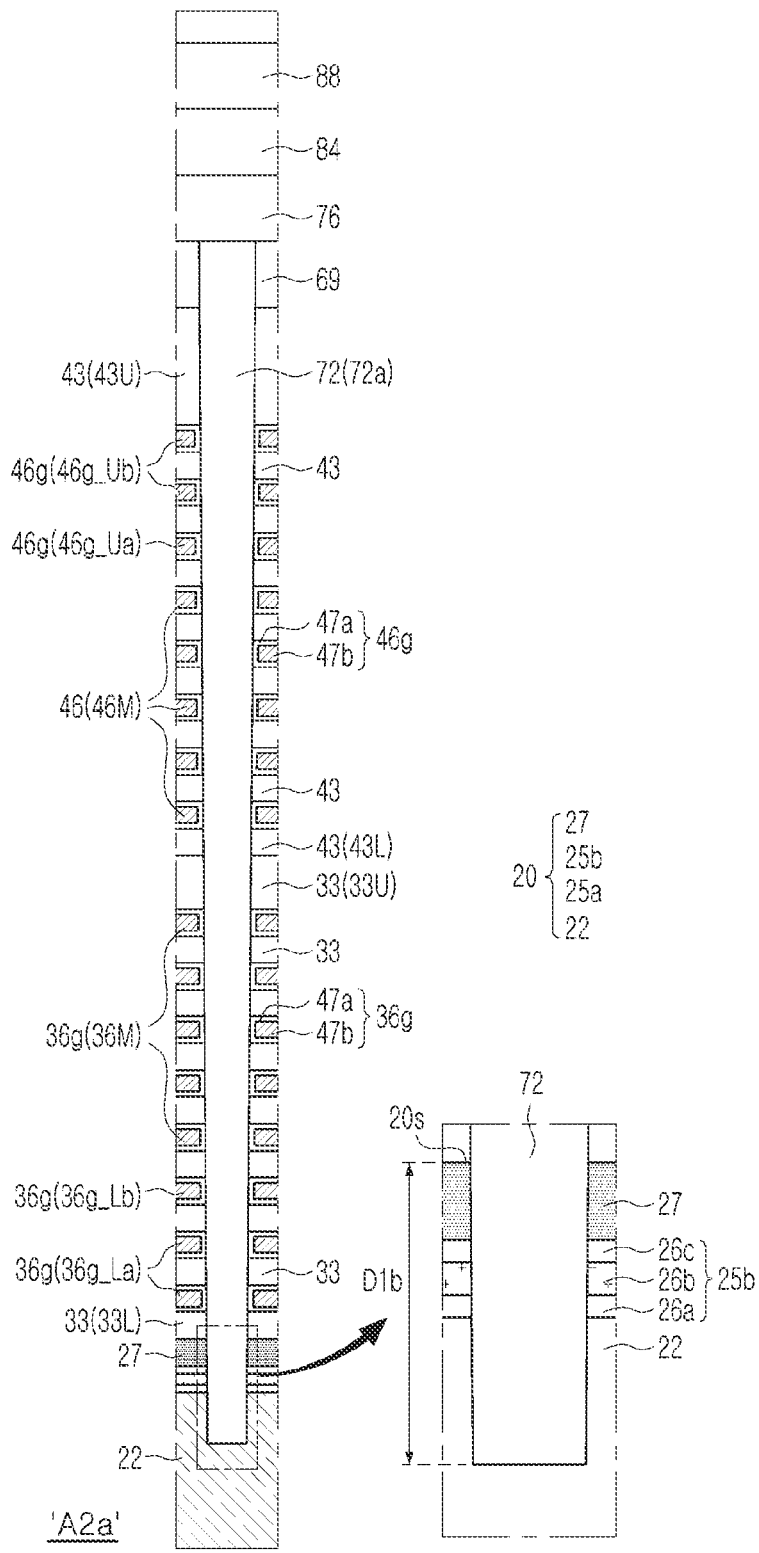
Figure 3C:
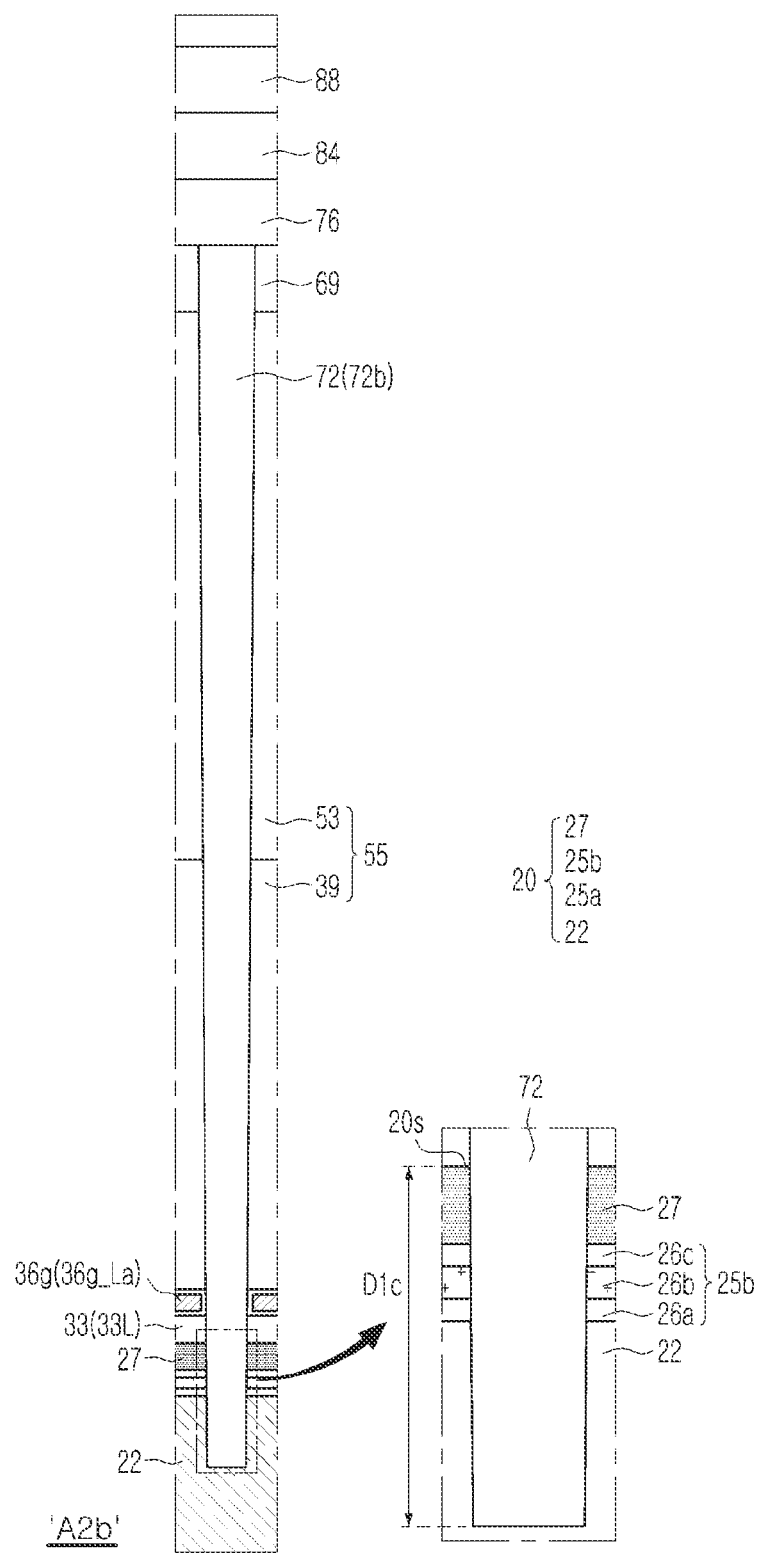

An example of the dummy vertical structures 72 will be described with reference to FIGS. 3B and 3C, wherein FIG. 3B is an enlarged cross-sectional diagram illustrating the portion "A2a" identified in FIG. 2C, and FIG. 3C is an enlarged cross-sectional diagram illustrating the portion "A2b" identified in FIG. 2C.

Referring to FIGS. 3B and 3C, upper surfaces of the dummy vertical structures 72 may be disposed on a level higher than a level of upper surfaces of the memory vertical structures 58. (See, e.g., FIG. 3A). The dummy vertical structures 72 may be formed of silicon oxide. The memory vertical structure 58 may include a material different from a material of the dummy vertical structures 72, a material of the channel layer 62 and a material of the pad pattern 66, for example.

Each of the dummy vertical structures 72 may have a width greater than that of the memory vertical structure 58 on one of levels.

The dummy vertical structures 72 may penetrate the upper pattern layer 27 and the second intermediate pattern layer 25b of the pattern structure 20 and may extend into the lower pattern layer 22. In an example, the second intermediate pattern layer 25b may include a first layer 26a, a second layer 26b, and a third layer 26c stacked in order. The first and third layers 25a and 25c of the second intermediate pattern layer 25b may be a silicon oxide layer, and the second layer 26b may be a silicon nitride or polysilicon layer.

A depth by which the dummy vertical structures 72 extend into the lower pattern layer 22 may be greater than a first depth D1a by which the memory vertical structure 58 extends from the upper surface 20s of the pattern structure 20 into the pattern structure 20. (See, e.g., FIG. 3A). For example, the dummy vertical structures 72 may include a first dummy vertical structure 72a (reference FIG. 3B)

adjacent to the memory cell array region MCA and a second dummy vertical structure 72b (reference FIG. 3C) spaced apart from the memory cell array region MCA.

The first dummy vertical structure 72a may extend from the upper surface 20s of the pattern structure 20 into the pattern structure 20 by a second depth D1b greater than the first depth D1a. (See, e.g., FIG. 3A). The second dummy vertical structure 72b may extend from the upper surface 20s of the pattern structure 20 into the pattern structure 20 by a third depth D1c greater than the first depth D1a. Here, the third depth D1c may be greater than the second depth D1b.

Embodiments of the first, second and third peripheral contact plugs 86p_1, 86p_2, and 86p_3 and the first, second and third peripheral contact spacer layers 74s_1 and 74s_2, and 74s_3 will be described with reference to FIGS. 4A, 4B, and 4C. Here, FIG. 4A is an enlarged cross-sectional diagram illustrating the portion "B1a" identified in FIG. 2A, FIG. 4B is an enlarged cross-sectional diagram illustrating the portion "B1b" identified in FIG. 2B, and FIG. 4C is an enlarged cross-sectional diagram illustrating the portion "B1c" identified in FIG. 2C.

Figure 4A:
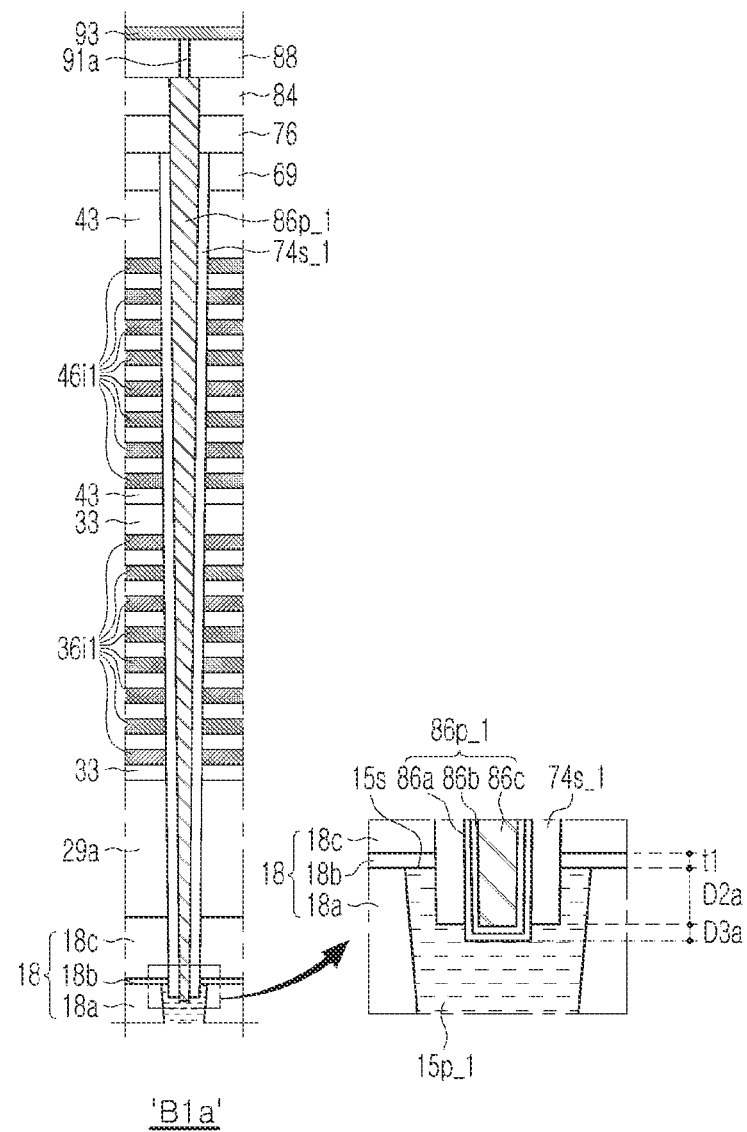
Figure 4B:
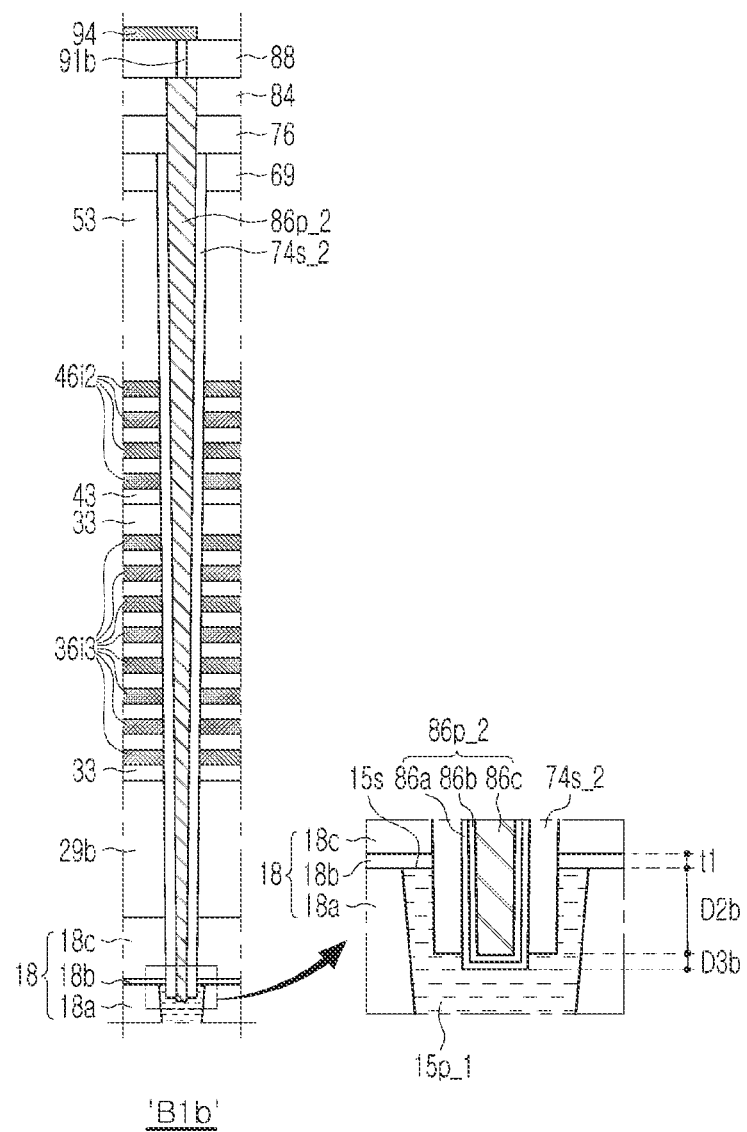
Figure 4C:
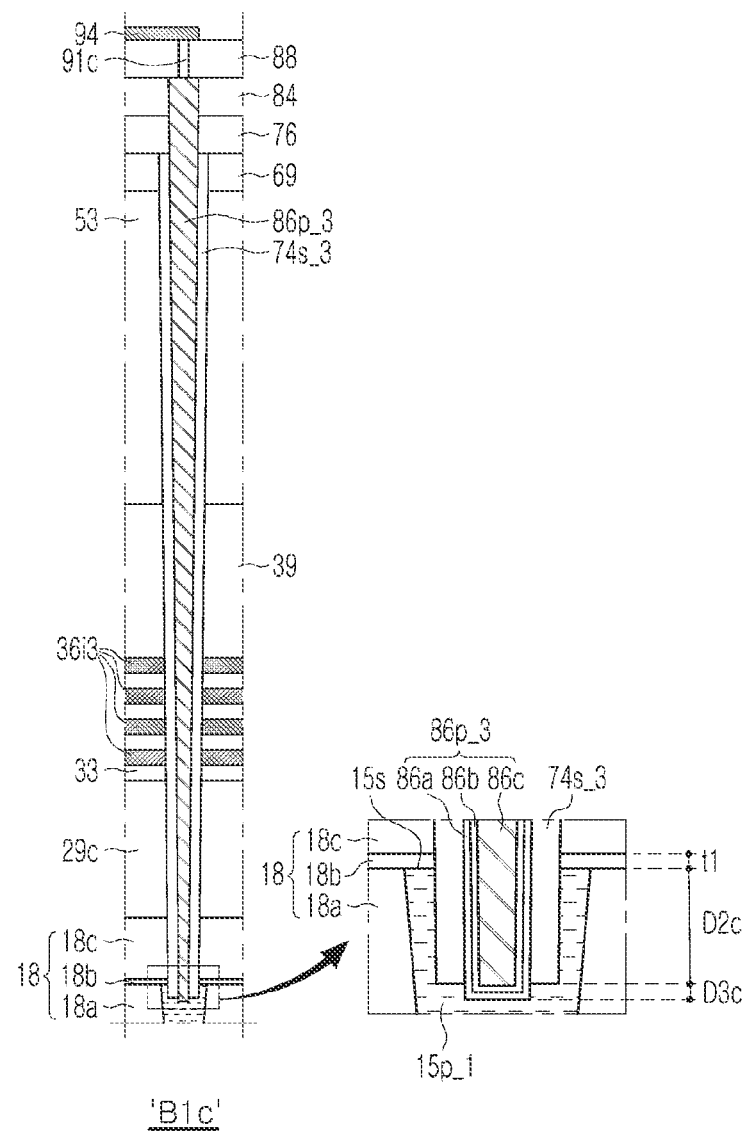

Referring to FIGS. 4A, 4B, and 4C, each of the first, second and third peripheral contact plugs 86p_1, 86p_2, and 86p_3 may include a plug conductive pattern 86c, a first conductive liner layer 86b covering a side surface and a bottom surface of the plug conductive pattern 86c, and a second conductive liner layer 86a covering an external surface and a bottom surface of the first conductive liner layer 86b. For example, the second conductive liner layer 86a may include a metal such as Ti, and the first conductive liner layer 86b may include a metal nitride such as TiN, and the plug conductive pattern 86c may include a metal such as W.

A width of each of the first, second and third peripheral contact spacer layers 74s_1, 74s_2, and 74s_3 in a horizontal direction may be less than a width of each of the first, second and third peripheral contact plugs 86p_1, 86p_2, and 86p_3.

Referring to FIG. 4A, the first peripheral contact spacer layer 74s_1 may extend from the upper surface 15s of the first peripheral pad pattern 15p_1 into the first peripheral pad pattern 15p_1 by a first depth D2a.

Referring to FIG. 4B, the second peripheral contact spacer layer 74s_2 may extend from the upper surface 15s of the second peripheral pad pattern (15p_2) into the second peripheral pad pattern 15p_2 by a second depth D2b greater than the first depth D2a. Referring to FIG. 4C, the third peripheral contact spacer layer 74s_3 may extend from the upper surface 15s of the third peripheral pad pattern 15p_3 into the third peripheral pad pattern 15p_3 by a third depth D2c greater than the second depth D2b.

In some embodiments, each of the first, second and third depths D2a, D2b, and D2c may be greater than the thickness t1 of the etch stop layer 18b.

The first, second and third peripheral contact plugs 86p_1, 86p_2, and 86p_3 may extend further into the first, second and third peripheral pad patterns 15p_1, 15p_2, and 15p_3 than the first, second and third peripheral contact spacer layers 74s_1, 74s_2, and 74s_3, respectively. For example, the first peripheral contact plug 86p_1 may extend further than a lower surface of the first peripheral contact spacer layer 74s_1 into the first peripheral pad pattern 15p_1 by a first depth D3a. The second peripheral contact plug 86p_2 may extend further into the second peripheral pad pattern 15p_2 than a lower surface of the second peripheral contact spacer layer 74s_2 by a second depth D3b, and the third peripheral contact plug 86p_3 may extend further into the third peripheral pad pattern 15p_3 than the lower surface of the third peripheral contact spacer layer 74s_3 by a third depth D3c.

In some embodiments, the first, second and third depths D3a, D3b, and D3c of the first, second and third peripheral contact plugs 86p_1, 86p_2, and 86p_3 may be less than the first, second and third depths D2a, D2b, and D2c of the first, second and third peripheral contact spacers 74s_1, 74s_2, and 74s_3.

For example, the first, second and third depths D3a, D3b, and D3c of the first, second and third peripheral contact plugs 86p_1, 86p_2, and 86p_3 may be less than the respective thicknesses of the horizontal layers 48.

Figure 5:
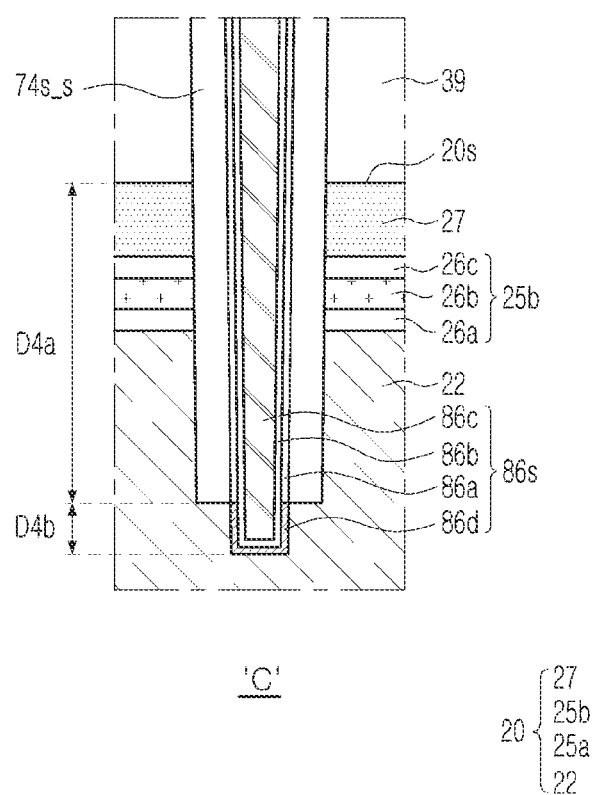

Hereafter, embodiments of the source contact plug 86s and the source contact spacer layer 74s_s will be described with reference to FIG. 5, wherein FIG. 5 is an enlarged cross-sectional diagram illustrating the portion "C" identified in FIG. 2B.

Referring to FIG. 5, the source contact plug 86s may include the plug conductive pattern 86c, and the first conductive liner layer 86b, and the second conductive liner layer 86a, that are constituently and respectively the same as the first, second and third peripheral contact plugs 86p_1, 86p_2, and 86p_3.

For example, a portion of the second conductive liner layer 86a contacting the lower pattern layer 22 may be formed of a metal-semiconductor compound layer 86d. The metal-semiconductor compound layer 86d may include metal silicide such as TiSi.

The source contact spacer layer 74s_s may extend from the upper surface 20s of the pattern structure 20 into the pattern structure 20 by a first depth D4a. The source contact spacer layer 74s_s may penetrate the upper pattern layer 27 and the second intermediate pattern layer 25b and may extend into the lower pattern layer 22.

The source contact plug 86s may extend further than the source contact spacer layer 74s_s into the lower pattern layer 22 by a first depth D4b. Referring to FIGS. 4A, 4B and 4C, the first depth D4b of the source contact plug 86s may be greater than the first, second and third depths D3a, D3b, and D3c of the first, second and third peripheral contact plugs 86p_1, 86p_2, and 86p_3. The first depth D4b of the source contact plug 86s may be greater than the thickness t1 of the etch stop layer 18b. (See. e.g., FIG. 4A).

Figure 6A:
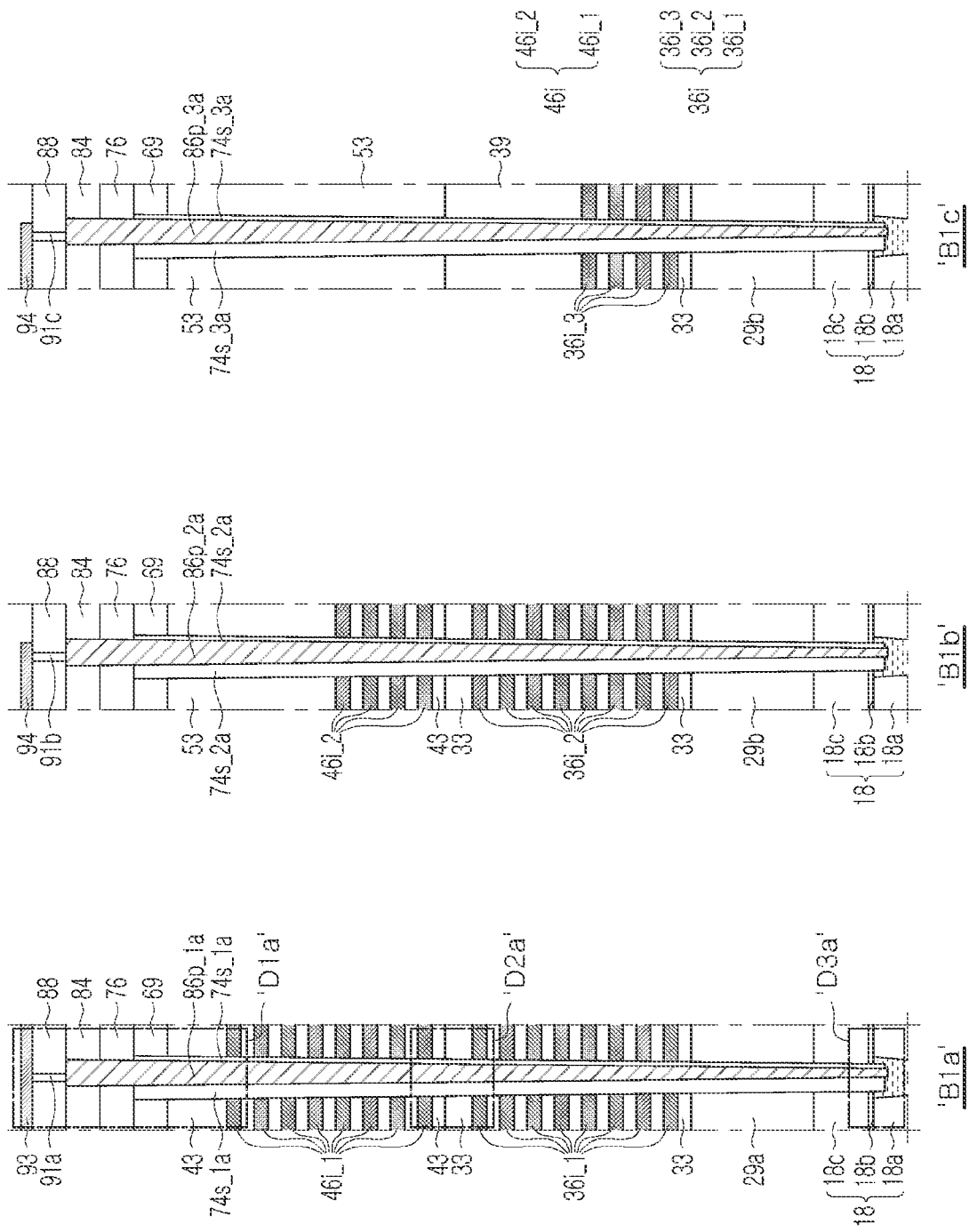

Modified examples of the first, second and third peripheral contact plugs 86p_1, 86p_2, and 86p_3 and the first, second and third peripheral contact spacer layers 74s_1, 74s_2, and 74s_3 previously described with reference to FIGS. 4A, 4B and 4C will be described with reference to FIGS. 6A and 6B, wherein FIG. 6A is an enlarged cross-sectional diagram illustrating the portion "B1a" identified in FIG. 4A, the portion "B1b" identified in FIG. 4B and the portion B1c identified in FIG. 4C. Here, FIG. 6B is an enlarged cross-sectional diagram illustrating portions "D1a," "D2a," and "D3a" of the portion "B1a" identified in FIG. 6A.

Figure 6B:
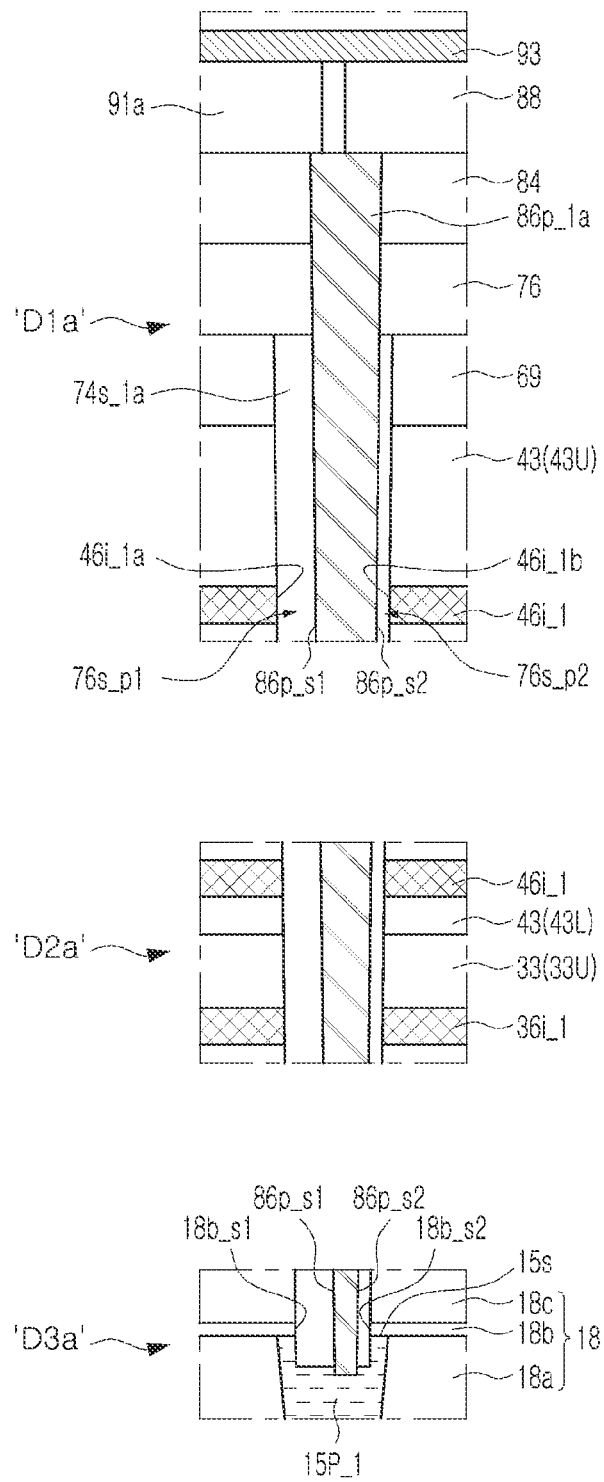

Referring to FIGS. 6A and 6B, each of the first, second and third peripheral contact plugs 86p_1a, 86p_2a, and 86p_3a may have first and second plug side surfaces 86p_s1 and 86p_s2 opposing each other, and in each of the first, second and third peripheral contact plugs 86p_1a, 86p_2a and 86p_3a, the second plug side surface 86p_s2 may be more adjacent to the insulating horizontal layers 36i and 46i than the first plug side surface 86p_s1. Each of the first, second and third peripheral contact spacer layers 74s_1a, 74s_2a, and 74s_3a may include a first spacer portion 76s_p1 covering the first plug side surface 86p_s1 of each of the first, second and third peripheral contact plugs 86p_1a, 86p_2a, and 86p_3a, and a second spacer portion 76s_p2 covering the second plug side surface 86p_s2 of each of the first, second and third peripheral contact plugs 86p_1a, 86p_2a, and 86p_3a. Any one of the first insulating horizontal layers 36i and 46i may include a first horizontal portion 46i_1a facing the first plug side surface 86p_s1 and a second horizontal portion 46i_1b facing the second plug side surface 86p_s2. The first spacer portion 76s_p1 may dispose between the first plug side surface 86p_s1 and the first horizontal portion 46i_1a. The second spacer portion 76s_p2 may dispose between the second plug side surface 86p_s2 and the second horizontal portion 46i_1b. The width of the first spacer portion 76s_p1 in a horizontal direction may be greater than a width of the second spacer portion 76s_p2 in the horizontal direction.

Figure 7A:
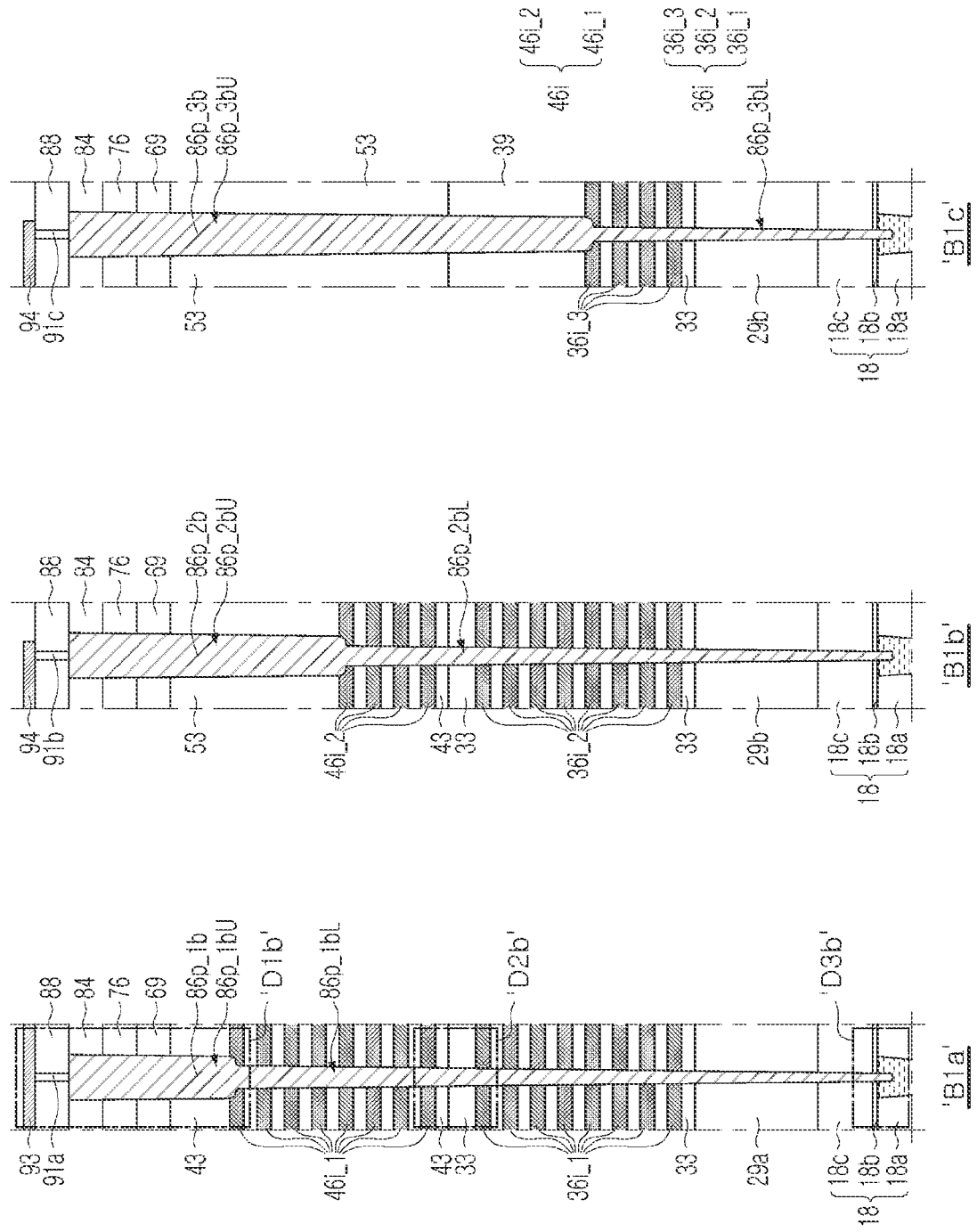

Modified examples of the first, second and third peripheral contact plugs 86p_1, 86p_2, 86p_3 and the first, second and third peripheral contacts spacer layers 74s_1, 74s_2, and 74s_3 will be described with reference to FIGS. 7A and 7B, wherein FIG. 7A is an enlarged cross-sectional diagram illustrating the portion "B1a" identified in FIG. 4A, the portion "B1b" identified in FIG. 4B and the portion "B1c" identified in FIG. 4C. Here, FIG. 7B is an enlarged cross-sectional diagram illustrating portions "D1b," "D2b," and "D3b" of the portion "B1a" identified in FIG. 7A.

Figure 7B:
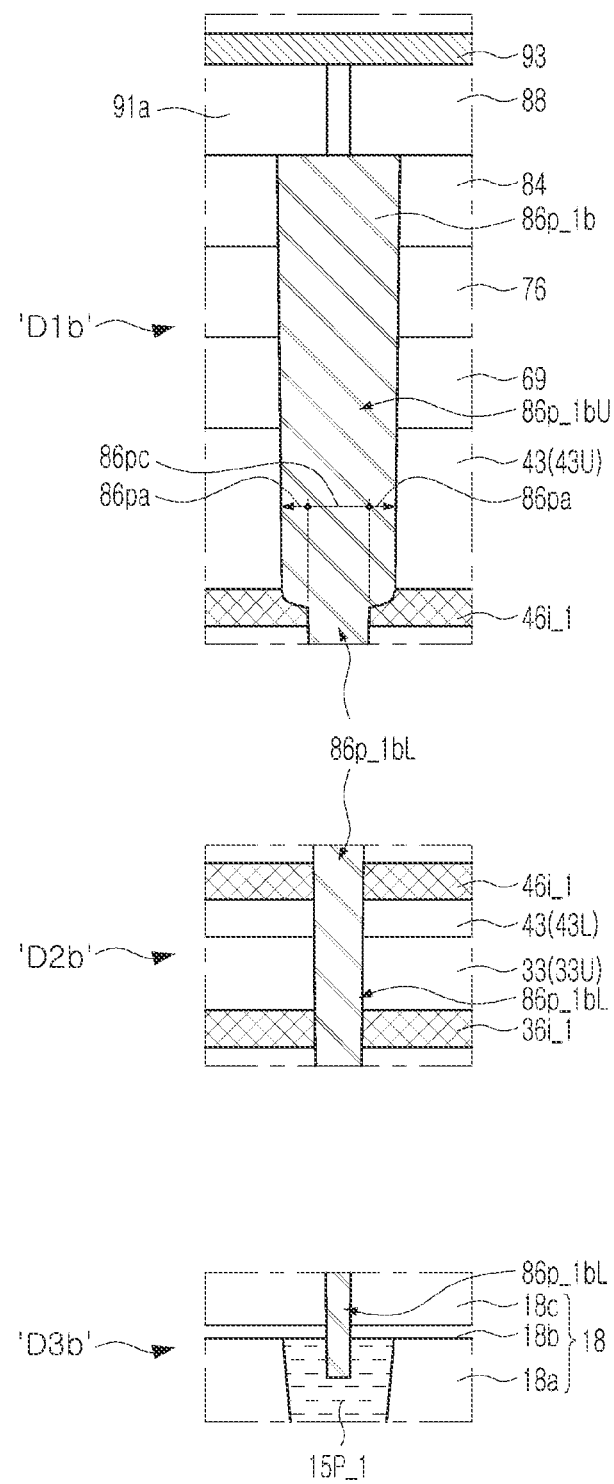

Referring to FIGS. 7A and 7B, the first, second and third peripheral contact spacer layers 74s_1, 74s_2, and 74s_3 previously described with reference to FIGS. 4A, 4B and 4C may not be provided.

The first peripheral contact plug 86p_1b may include a lower plug portion 86p_1bL and an upper plug portion 86p_1bU having a width greater than that of the lower plug portion 86_1bL on the lower plug portion 86_1bL. The upper plug portion 86p_1bU may contact the first upper insulating horizontal layer 46i_1, disposed on an upper portion, of the insulating horizontal layers 36i and 46i adjacent to the first peripheral contact plug 86p_1b and may be disposed on a level higher than a level of the first upper insulating horizontal layer 46i_1 disposed on an upper portion. In the first upper insulating horizontal layer 46i_1, a minimum thickness of a portion of the first upper insulating horizontal layer 46i_1 contacting the upper plug portion 86p_1bU may be less than a thickness of the other portion.

In the first peripheral contact plug 86p_1b, the upper plug portion 86p_1bU may include a first portion 86pc overlapping the lower plug portion 86_1bL and a second portion 86pa overlapping the insulating horizontal layers 36i and 46i.

The second peripheral contact plug 86p_2b may include a lower plug portion 86p_2bL and an upper plug portion 86p_2bU having a width greater than that of the lower plug portion 86_2bL on the lower plug portion 86_2bL. The upper plug portion 86p_2bU may contact the second upper insulating horizontal layer 46i_2 disposed on the upper portion of the insulating horizontal layers 36i and 46i adjacent to the second peripheral contact plug 86p_2b and may be disposed on a level higher than a level of the second upper insulating horizontal layer 46i_2 disposed on an upper portion.

The third peripheral contact plug 86p_3b may include a lower plug portion 86p_3bL and an upper plug portion 86p_3bU having a width greater than that of the lower plug portion 86_3bL on the lower plug portion 86_3bL. The upper plug portion 86p_3bU may contact the third lower insulating horizontal layer 36i_3, disposed in an upper portion, of the insulating horizontal layers 36i and 46i adjacent to the third peripheral contact plug 86p_3b and may be disposed on a level higher than a level at which the third lower insulating horizontal layer 36i_3 is disposed in an upper portion.

In the first peripheral contact plug 86p_1b, a vertical height of the upper plug portion 86p_1bU may be less than a height of the lower plug portion 86p_1bL. In the third peripheral contact plug 86p_3b, a vertical height of the upper plug portion 86p_3bU may be greater than a height of the lower plug portion 86p_3bL. A vertical height of the upper plug portion 86p_1bU of the first peripheral contact plug 86p_1b may be less than a height of the upper plug portion 86p_3bU of the third peripheral contact plug 86p_3b.

Referring to FIGS. 7A and 7B, a central axis of each of the upper plug portions 86p_1bU, 86p_2bU, and 86p_3bU may be vertically aligned with a central axis of each of the lower plug portions 86p_1bL, 86p_2bL, and 86p_3bL.

Figure 8:
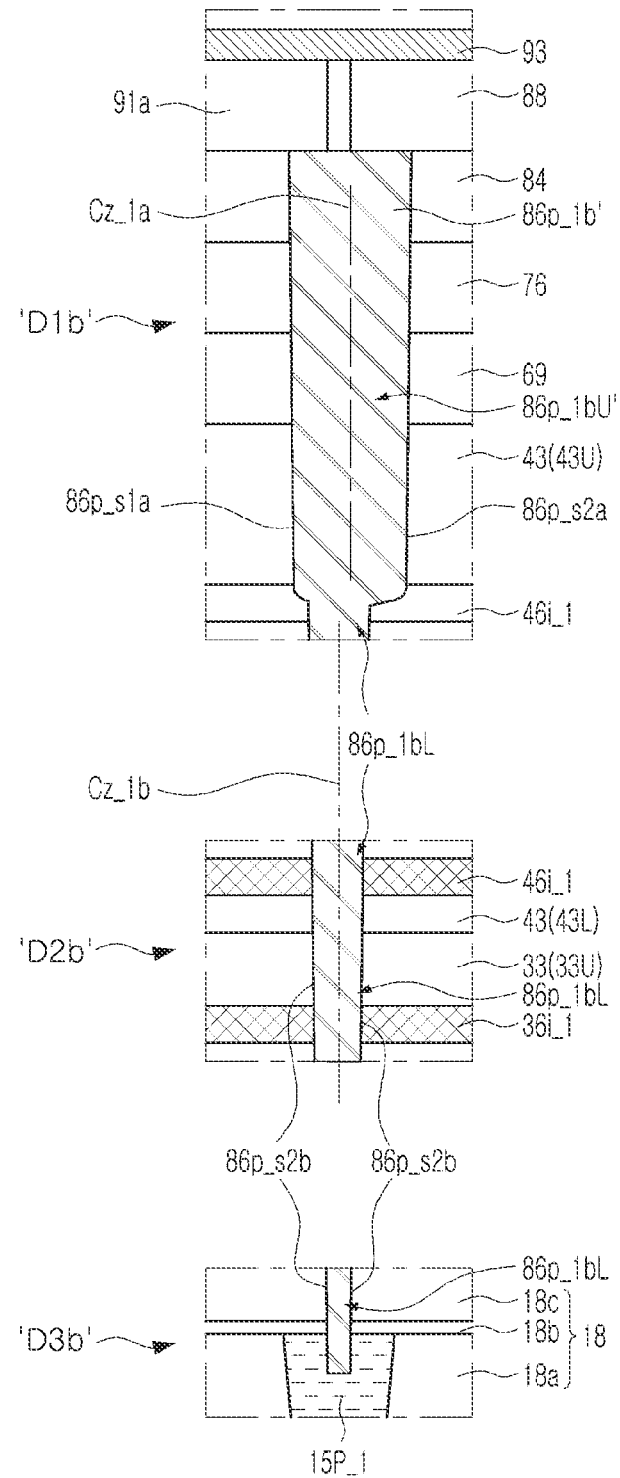

Hereafter, modified examples of the upper plug portion 86p_1bU, 86p_2bU, and 86p_3bU of FUGS. 7A and 7B will be described with reference to FIG. 8, wherein FIG. 8 is an enlarged cross-sectional diagram corresponding to the enlarged cross-sectional of FIG. 7B. Here, the term "central axis" denotes an arbitrary axis crossing a center between both side surfaces of an element or region.

Referring to FIGS. 7A and 8, each of the upper plug portions 86p_1bU, 86p_2bU, and 86p_3bU illustrated in FIG. 7A may be modified to have a central axis that is misaligned with a central axis of the lower plug portions 86p_1bL, 86p_2bL, and 86p_3bL. For example, in the first peripheral contact plug 86p_1b', a first central axis $Cz\_1a$ of the upper plug portion 86p_1bU' may be misaligned with a second central axis $Cz\_1b$ of the lower plug portion 86p_1bL.

Figure 9A:
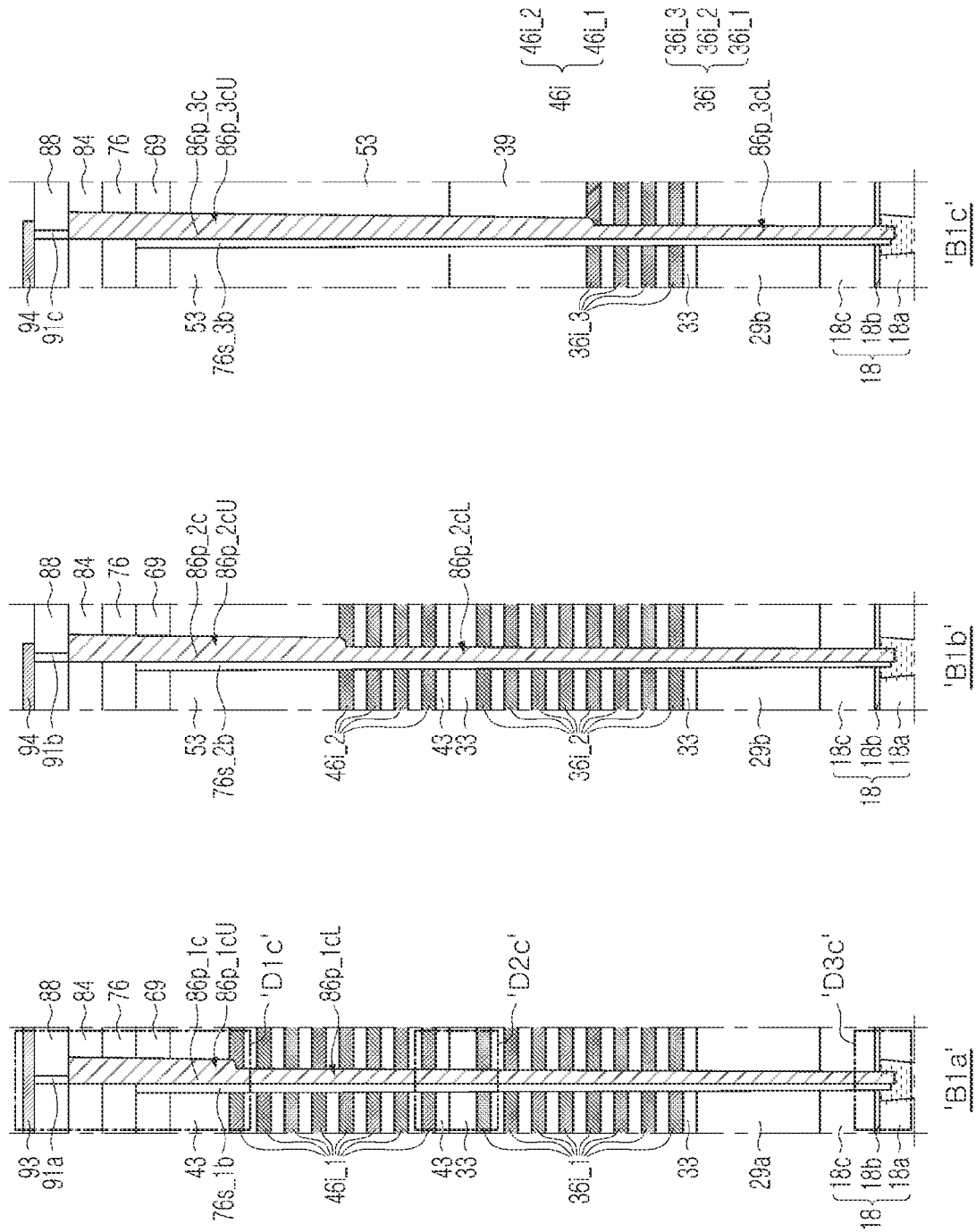

Modified examples of the first, second and third peripheral contact plugs 86p_1, 86p_2, 86p_3 and the first, second and third peripheral contact spacer layers 74s_1, 74s_2, and 74s_3 described with reference to FIGS. 4A, 4B and 4C will be described with reference to FIGS. 9A and 9B, wherein FIG. 9A is an enlarged diagram illustrating the portion "B1b" identified in FIG. 4B, the portion "B1b" identified in FIG. 4B and the portion "B1c" identified in FIG. 4C. Here, FIG. 9B is an enlarged diagram illustrating portions "D1c," "D2c," and "D3c" of the portion "B1a" of FIG. 9A.

Figure 9B:
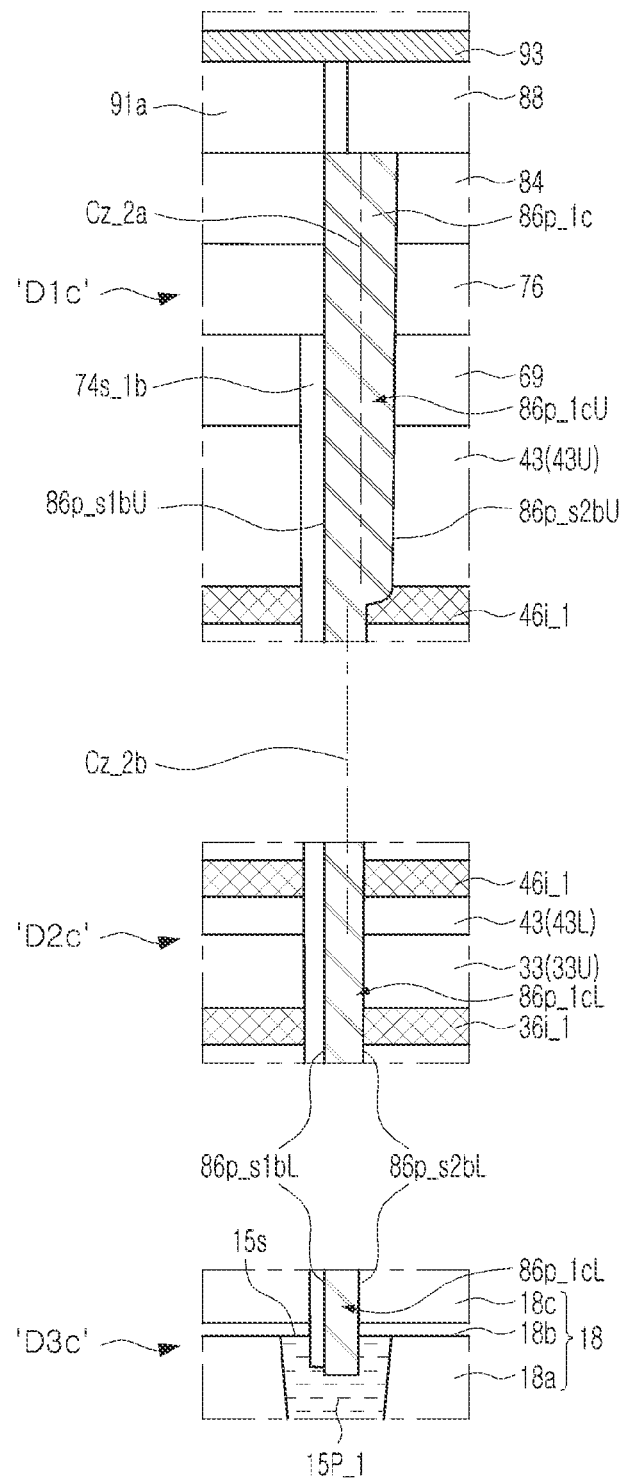

Referring to FIGS. 9A and 9B, the first, second and third peripheral contact plugs 86p_1c, 86p_2c, and 86p_3c may include lower plug portions 86p_1cL, 86p_2cL, and 86p_3cL having a first width, and upper plug portions 86p_1cU, 86p_2cU, and 86p_3cU having a second width greater than the first width and disposed on the lower plug portions 86p_1cL, 86p_2cL, and 86p_3cL. The upper plug portions 86p_1cU, 86p_2cU, and 86p_3cU may be disposed on the same level as that of the upper plug portions 86p_1bU, 86p_2bU, and 86p_3bU, as described, for example, in FIG. 7A.

A first central axis $Cz\_2a$ of each of the upper plug portions 86p_1cU, 86p_2cU, and 86p_3cU may not be aligned with a second central axis $Cz\_2b$ of each of the lower plug portions 86p_1cL, 86p_2cL, and 86p_3cL.

In the first, second and third peripheral contact plugs 86p_1c, 86p_2c, and 86p_3c, each of the lower plug portions 86p_1cL, 86p_2cL, and 86p_3cL may have a first lower side surface 86p_s1bL and a second lower side surface 86p_s2bL opposing each other, and each of the upper plug portions 86p_1cU, 86p_2cU, and 86p_3cU may have a first upper side surface 86p_s1bU and a second upper side surface 86p_s2bU opposing each other. The first lower side 86p_s1bL and the first upper side 86p_s1bU may be aligned with each other, and the second upper side 86p_s2bU may not be aligned with the second lower side 86p_s2bL. Accordingly, the first, second and third peripheral contact plugs 86p_1c, 86p_2c, and 86p_3c may have asymmetric side surfaces.

The first, second and third peripheral contact spacer layers 74s_1b, 74s_2b, and 74s_3b may cover the first lower side 86p_s1bL and the first upper side 86p_s1bU of the first, second and third peripheral contact plugs 86p_1c, 86p_2c, and 86p_3c. In the first, second and third peripheral contact plugs 86p_1c, 86p_2c, and 86p_3c, the second lower side surface 86p_s2bL may contact the insulating horizontal layers 36i and 46i. The upper plug portions 86p_1cU, 86p_2cU, and 86p_3cU may include portions overlapping the insulating horizontal layers 36i and 46i.

Figure 10A:
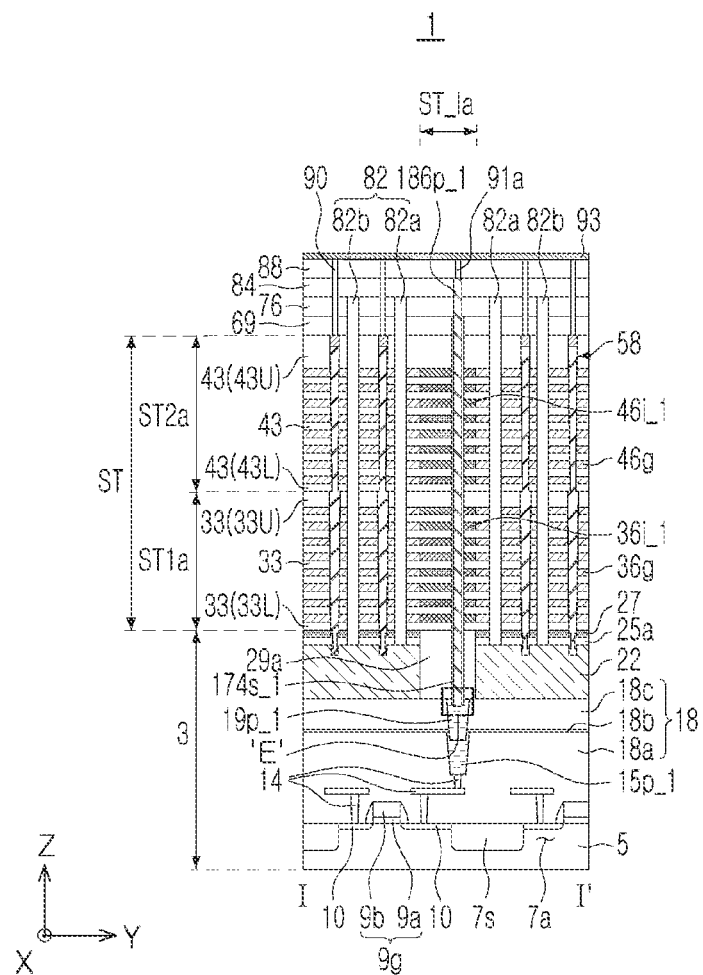
Figure 10B:
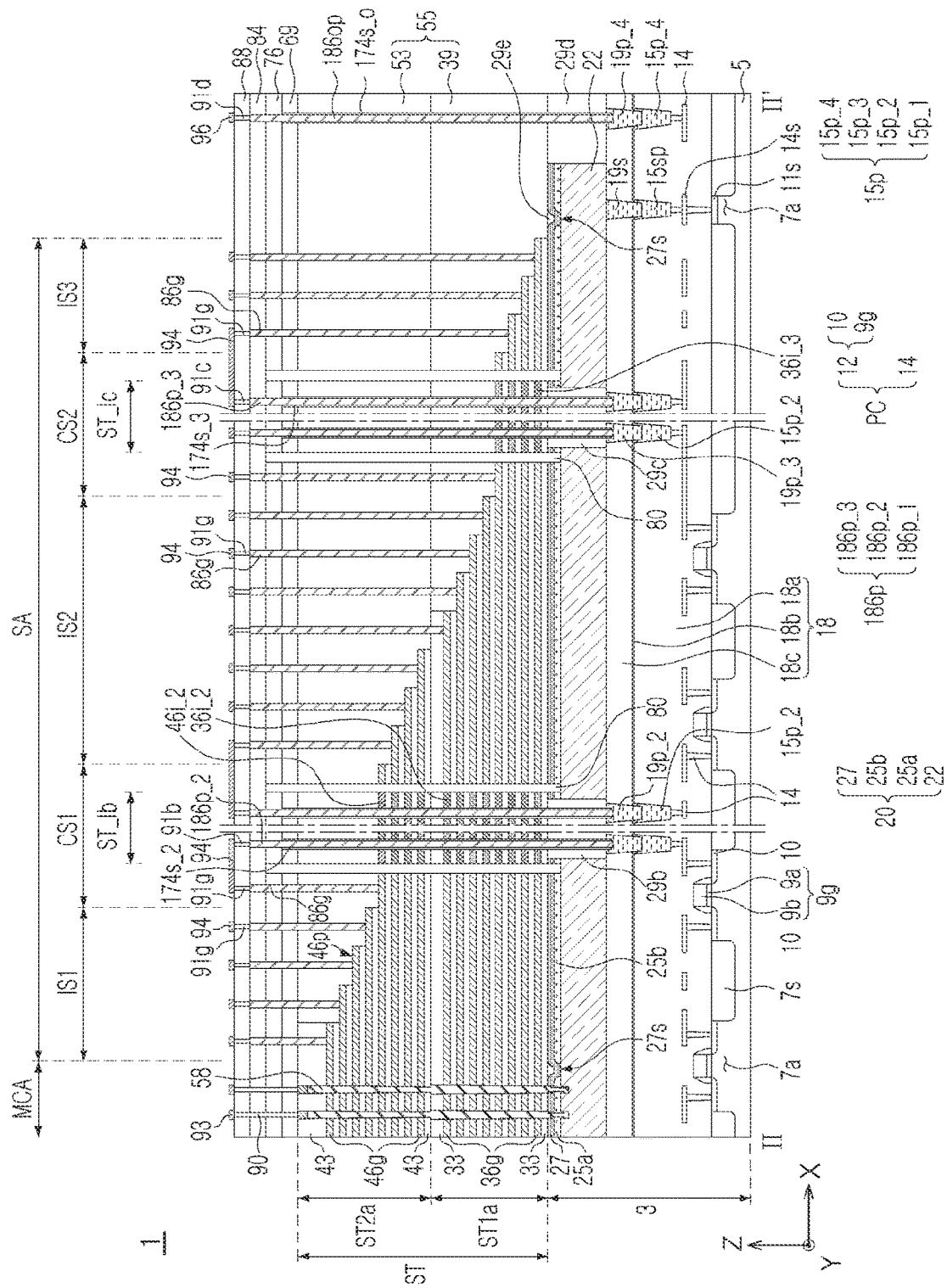
Figure 10C:
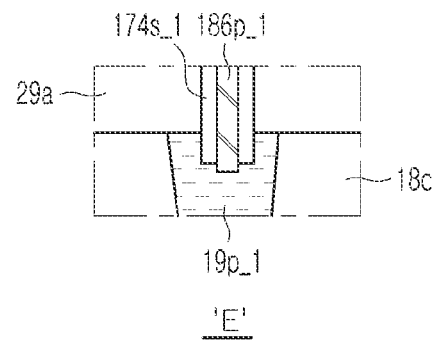

A modified example of the semiconductor device 1 will now be described with reference to FIGS. 10A, 10B and 10C, wherein FIG. 10A is a cross-sectional diagram taken along line I-I', FIG. 10B is a cross-sectional diagram taken along line II-II' and FIG. 10C is an enlarged cross-sectional diagram illustrating the portion "E" identified in FIG. 10A.

Referring to FIGS. 10A, 10B, and 10C, the lower structure 3 of the semiconductor device 1 may further include buffer pad patterns 19p_1, 19p_2, 19p_3, and 19p_4 contacting the peripheral pad patterns 15p on the peripheral pad patterns 15p. The ground pattern 22V of FIG. 2B may be replaced with a source buffer pad pattern 19s formed of the same material as that of the buffer pad patterns 19p_1, 19p_2, 19p_3, and 19p_4. The source buffer pad pattern 19s may be electrically connected to the source pad pattern 15sp disposed in a lower portion of the source buffer pad pattern 19s. A source wiring structure 14s electrically connected to the source pad pattern 15sp may be disposed in a lower portion of the source pad pattern 15sp. A source control element 11s of the peripheral circuit PC electrically connected to the source wiring structure 14s may be disposed.

In some embodiments, upper surfaces of the buffer pad patterns 19p_1, 19p_2, 19p_3, and 19p_4 and the source buffer pad pattern 19s may be disposed at substantially the same level as a level of the upper surface of the lower insulating structure 18.

For example, when the source buffer pad pattern 19s is disposed, the source contact plug 86s of FIG. 2B may not be provided, and the source connection wiring 95 of FIG. 2B may be replaced with an outer element connection wiring 96.

Thus, the peripheral contact plugs 86p of FIGS. 2A and 2B and the outer peripheral contact plug 86op of FIG. 2B may be respectively modified to a peripheral contact plugs 186p and an outer peripheral contact plugs 186op contacting the buffer pad patterns 19p_1, 19p_2, 19p_3, and 19p_4. Here, the contact spacer layers 74s_1, 74s_2, 74s_3, and 74s_o described with reference to FIGS. 2A and 2B may be modified to contact spacer layers 174s_1, 174s_2, 174s_3, and 174s_o contacting the buffer pad patterns 19p_1, 19p_2, 19p_3, and 19p_4. For example, the peripheral contact plugs 186p may include a first peripheral contact plug 186p_1 penetrating the first insulating region ST_Ia to contact the first buffer pad pattern 19p_1, a second peripheral contact plug 186p_2 penetrating the second insulating region ST_Ib to contact the second buffer pad pattern 19p_2, and a third peripheral contact plug 186p_3 penetrating the third insulating region ST_Ic to contact the second buffer pad pattern 19p_3.

The shape of portions of the first peripheral contact plug 186p_1 and the first contact spacer layer 174s_1 contacting the first buffer pad pattern 19p_1 may be substantially the same as a shape of portions of the first peripheral contact plug 86p_1 and the first contact spacer layer 74s_1 contacting the first peripheral pad pattern 15p_1 described with reference to FIG. 4A. The shape of portions of the second peripheral contact plug 186p_2 and the second contact spacer layer 174s_2 contacting the second buffer pad pattern 19p_2 may be substantially the same as a shape of portions of second peripheral contact plug 86p_2 and the second contact spacer layer 74s_2 in contact second peripheral pad pattern 15p_2 described with reference to FIG. 4B. The shape of portions of the third peripheral contact plug 186p_3 and the second contact spacer layer 174s_3 contacting the third buffer pad pattern 19p_3 may be substantially the same as a shape of portions of third peripheral contact plug 86p_3 and the third contact spacer layer 74s_3 contacting the third peripheral pad pattern 15p_3 described with reference to FIG. 4C.

In some embodiments, the first, second and third peripheral contact plugs 186p_1, 186p_2, 186p_3 and the third contact spacer layers 174s_1, 174s_2, and 174s_3 contacting the first, second and third peripheral contact plugs 186p_1, 186p_2, 186p_3 may be variously modified. For example, the first, second and third peripheral contact plugs 186p_1, 186p_2, 186p_3 and the first, second and third contact spacer layers 174s_1, 174s_2 and 174s_3 which may be modified as illustrated in FIGS. 11A, 11B and 11C.

Figure 11A:
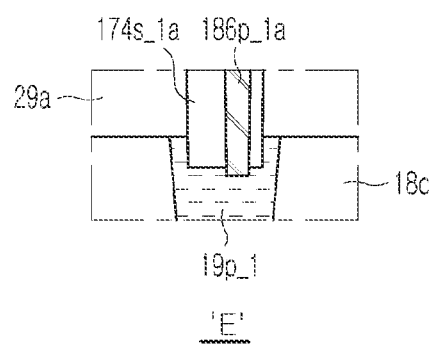

In one modified example of FIG. 11A, the first, second and third peripheral contact plugs 186p_1, 186p_2 and 186p_3 and the first, second and third contact spacer layers 174s_1, 174s_2, and 174s_3 in FIGS. 10A and 10B may be modified similarly to the first, second and third peripheral contact plugs 86p_1a, 86p_2a, and 86p_3a and the first, second and third contact spacer layers 74s_1a, 74s_2a, and 74s_3a of FIGS. 6A and 6B. Here, FIG. 11A is an enlarged diagram illustrating a portion in which the first peripheral contact plug 186p_1a and the first contact spacer layer 174s_1a contacting the first buffer pad pattern 19p_1.

Figure 11B:
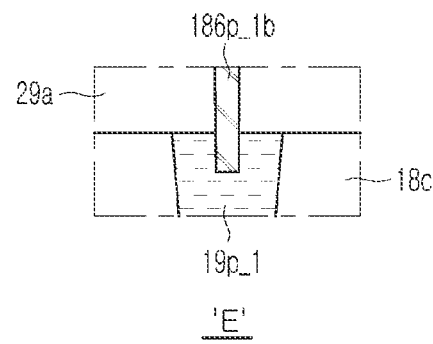

In another modified example of FIG. 11B, the first, second and third contact spacer layers 174s_1, 174s_2, and 174s_3 in FIGS. 10A and 10B may not be provided, and the first, second and third peripheral contact plugs 186p_1, 186p_2, and 186p_3 in FIGS. 10A and 10B may be modified in the same manner as the first, second and third peripheral contact plugs 86p_1a, 86p_2a, and 86p_3a of FIGS. 7A, 7B and 8. Here, FIG. 11B is an enlarged diagram illustrating a portion in which the first peripheral contact plug 186p_1b contacting the first buffer pad pattern 19p_1.

Figure 11C:
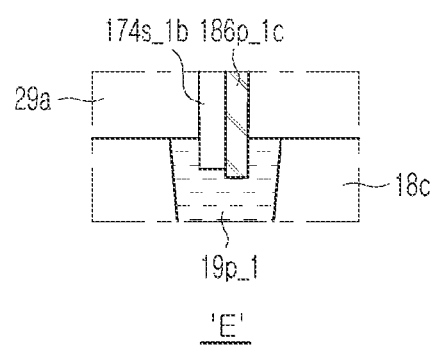

In another modified example of FIG. 11C, the first, second and third peripheral contact plugs 186p_1, 186p_2 and 186p_3 and the first, second and third contact spacer layers 174s_1 174s_2 and 174s_3 illustrated in FIGS. 10A and 10B may be modified in the same manner as the first, second and third peripheral contact plugs 86p_1c, 86p_2c and 86p_3c and the first, second and third contact spacer layers 74s_1b, 74s_2b, and 74s_3b of FIGS. 9A and 9B. Here, FIG. 11C is an enlarged diagram illustrating a portion in which the first contact spacer layer 174s_1b contacting the first buffer pad pattern 19p_1.

Figure 12A:
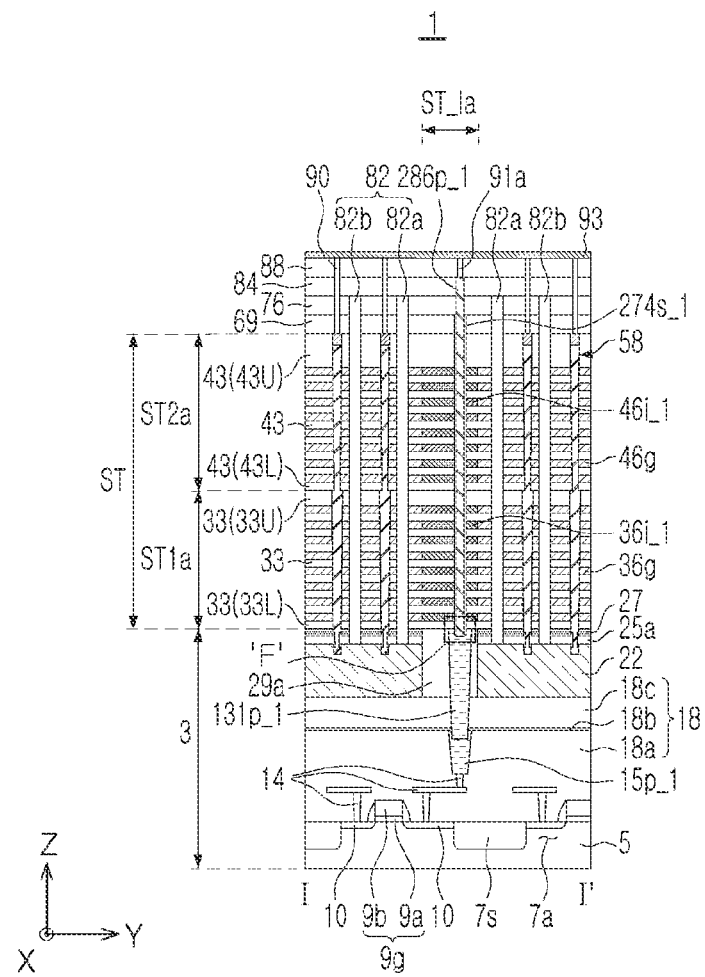
Figure 12B:
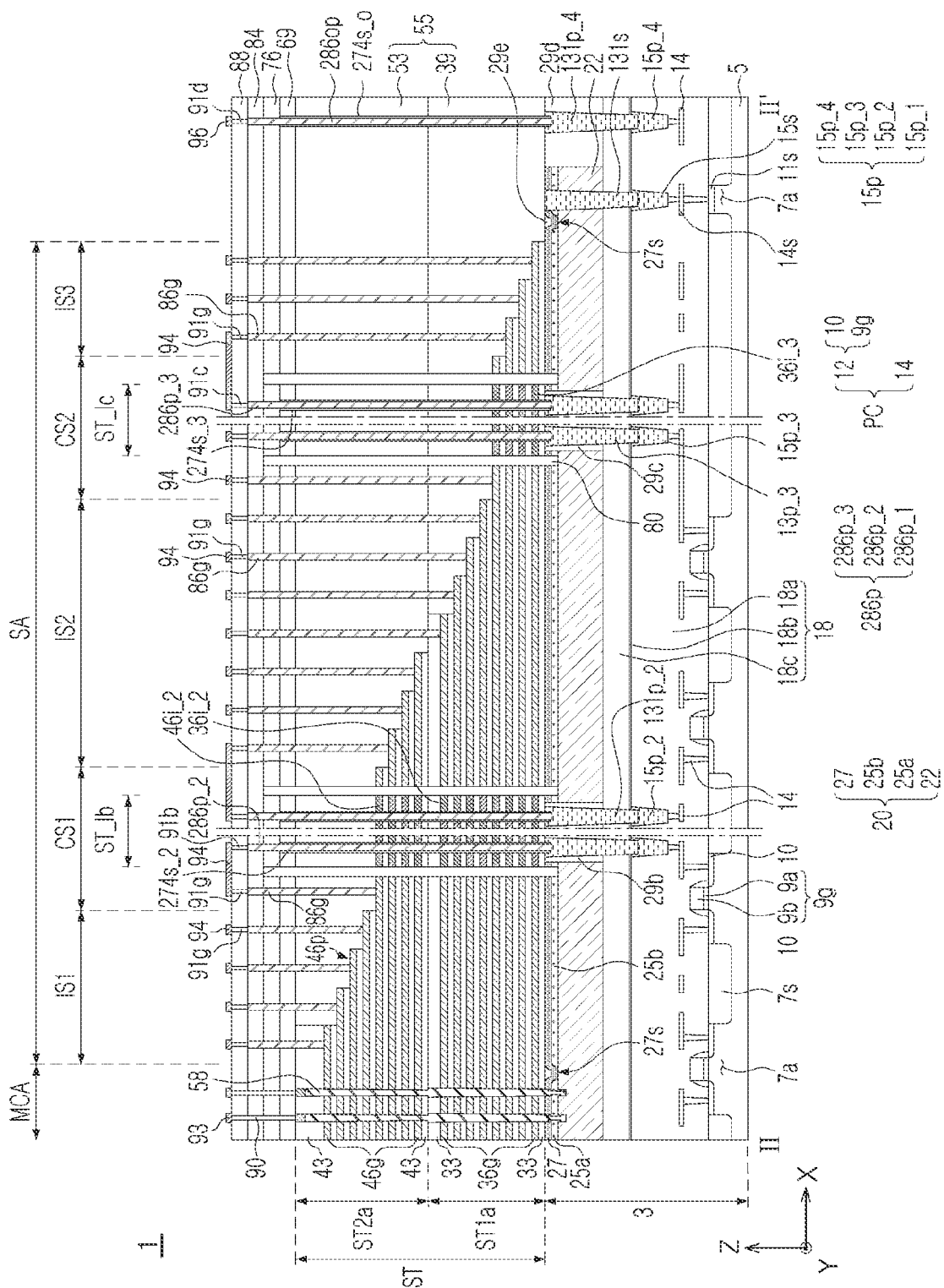
Figure 13:
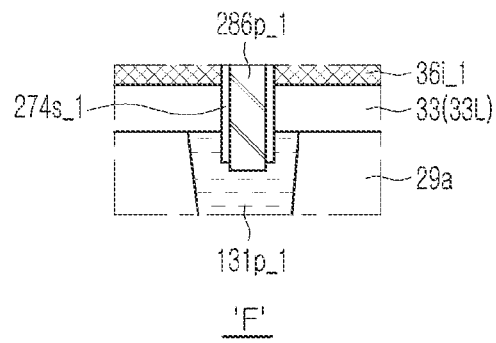

Hereafter, the modified examples of the buffer pad patterns 19p_1, 19p_2, 19p_3, and 19p_4 and the source pad pattern 19s of FIGS. 10A, 10B and 10C will be described with reference to FIGS. 12A, 12B, and 12C, wherein FIG. 12A is a cross-sectional diagram taken along line I-I', FIG. 12B is a cross-sectional diagram taken along line and FIG. 13 is an enlarged cross-sectional diagram illustrating portion "F" identified in FIG. 12A.

Referring to FIGS. 12A, 12B, and 13, the buffer pad patterns 19p_1, 19p_2, 19p_3, and 19p_4 and the source buffer pad pattern 19s described in FIGS. 10A, 10B, and 10C may be modified to the buffer pad patterns 131p_1, 131p_2, 131p_3, and 131p_4 and the source buffer pad pattern 131s illustrated in FIGS. 12A, 12B, and 12C, respectively. For example, the buffer pad patterns 131p_1, 131p_2, 131p_3, and 131p_4 may contact the peripheral pad patterns 15p, may extend upwardly, and may penetrate the first, second and third gap-fill insulating layers 29a, 29b, and 29c, and the source buffer pad pattern 131s may contact the source pad pattern 15s, may extend upwardly, and may penetrate the pattern structure 20. Upper surfaces of the buffer pad patterns 131p_1, 131p_2, 131p_3, and 131p_4 and the source buffer pad patterns 131s may be disposed on the same level as a level of the upper surface of the pattern structure 20.

The peripheral contact plugs 186p and the outer peripheral contact plug 186op described in FIGS. 10A and 10B may be modified to the peripheral contact plugs 286p and the outer peripheral contact plug 286op contacting the buffer pad patterns 131p_1, 131p_2, 131p_3, and 131p_4, as described with reference to FIGS. 10A and 10B. The contact spacer layers 174s_1, 174s_2, 174s_3, and 174s_o described with reference to FIGS. 10A and 10B may be modified to the contact spacer layers 274s_1, 274s_2, 274s_3 and 274s_o contacting the buffer pad patterns 131p_1, 131p_2, 131p_3 and 131p_4, respectively. For example, the peripheral contact plugs 286p may include a first peripheral contact plug 286p_1 penetrating the first insulating region ST_Ia and contacting the first buffer pad pattern 131p_1, a second peripheral contact plug 286p_2 penetrating the second insulating region ST_Ib and contacting the second buffer pad pattern 131p_2, and a third peripheral contact plug 286p_3 penetrating the third insulating region ST_Ic and contacting the third buffer pad pattern 131p_3.

The shape of portions of the first peripheral contact plug 286p_1 and the first contact spacer layer 274s_1 contacting the first buffer pad pattern 131p_i may be substantially the same as a shape of portions of the first peripheral contact plug 86p_1 and the first contact spacer layer 74s_1 contacting the first peripheral pad pattern 15p_1. The shape of portions of the second peripheral contact plug 286p_2 and the second contact spacer layer 274s_2 contacting the second buffer pad pattern 131p_2 may be substantially the same as a shape of portions of the second peripheral contact plug 86p_2 and the second contact spacer layer 74s_2 contacting the second peripheral pad pattern 15p_2, as described with reference to FIG. 4B. The shape of portions of the third peripheral contact plug 286p_3 and the second contact spacer layer 274s_3 contacting the third buffer pad pattern 131p_3 may be substantially the same as a shape of portions of the third peripheral contact plug 86p_3 and the third contact spacer layer 74s_3 contacting the third peripheral pad pattern 15p_3, as described with reference to FIG. 4C.

In some embodiments, the first, second and third peripheral contact plugs 286p_1, 286p_2, and 286p_3 and the first, second and third contact spacer layers 274s_1, 274s_2, and 274s_3 contacting the first, second and third peripheral contact plugs 286p_1, 286p_2, and 286p_3 may be variously modified. Modified examples of the first, second and third peripheral contact plugs 286p_1, 286p_2 and 286p_3 and the first, second and third contact spacer layers 274s_1, 274s_2 and 274s_3 will be described in relation to FIGS. 14A, 14B and 14C.

Figure 14A:
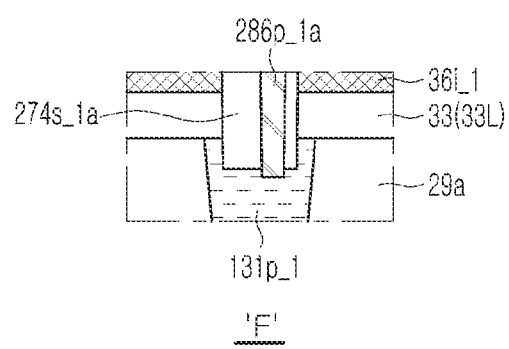

Referring to FIG. 14A, the first, second and third peripheral contact plugs 286p_1, 286p_2 and 286p_3 and the first, second and third contact spacer layers 274s_1, 274s_2 and 274s_3 of FIGS. 12A and 12B may be modified in the same manner as the first, second and third peripheral contact plugs 86p_1 a, 86p_2a and 86p_3a and the first, second and third contact spacer layers 74s_1a, 74s_2a, and 74s_3a of FIGS. 6A and 6B. Here, FIG. 14A is an enlarged cross-sectional diagram illustrating a portion in which the first peripheral contact plug 286p_1a and the first contact spacer layer 274s_1a contacting the first buffer pad pattern 131p_1.

Figure 14B:
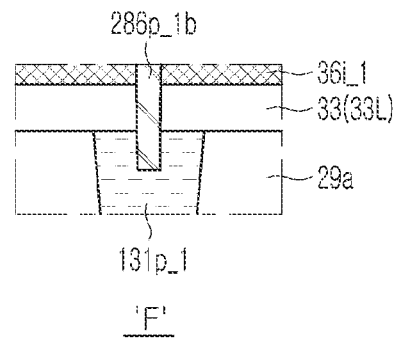

Referring to FIG. 14B, the first, second and third contact spacer layers 274s_1, 274s_2, and 274s_3 in FIGS. 12A and 12B may not be provided, and the first, second and third peripheral contact plugs 286p_1, 286p_2, and 286p_3 of FIGS. 12A and 12B may be modified in the same manner as the first, second and third peripheral contact plugs 86p_1a, 86p_2a, and 86p_3a of FIGS. 7A, 7B and 8. Here, FIG. 14 is an enlarged cross-sectional diagram illustrating a portion in which the first peripheral contact plug 286p_1b contacting the first buffer pad pattern 131p_1.

Figure 14C:
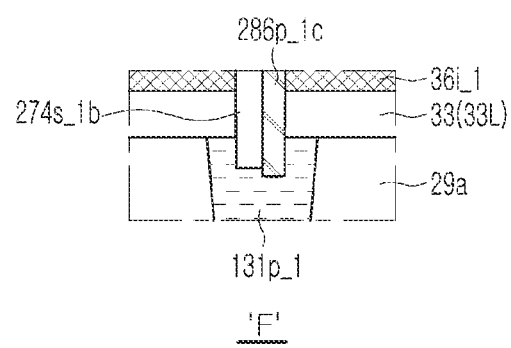

Referring to FIG. 14C, the first, second and third peripheral contact plugs 286p_1, 286p_2, and 286p_3 and the first, second and third contact spacer layers 274s_1, 274s_2 and 274s_3 of FIGS. 12A and 12B may be modified in the same manner as the first, second and third peripheral contact plugs 86p_1c, 86p_2c and 86p_3c and the first, second and third contact spacer layers 74s_1b, 74s_2b and 74s_3b illustrated of FIGS. 9A and 9B. Here, FIG. 14C is an enlarged cross-sectional diagram illustrating a portion in which the first peripheral contact plug 286p_1c contacting the first contact spacer layer 274s_1b.

Figure 16A:
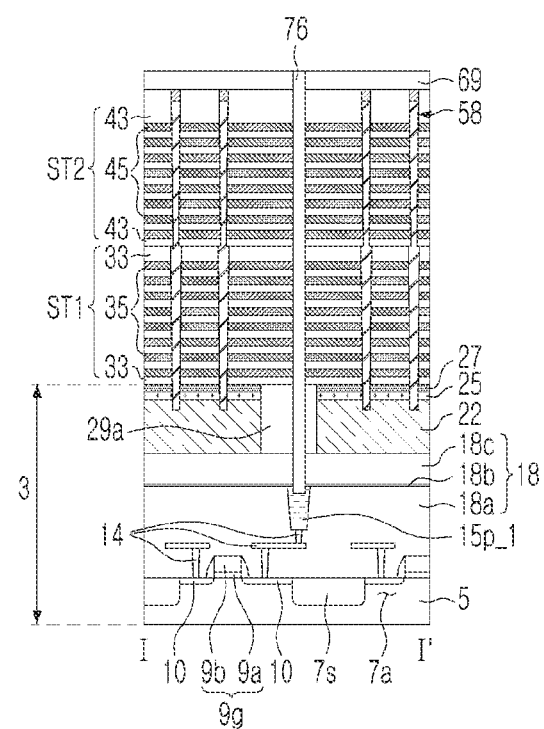
Figure 16B:
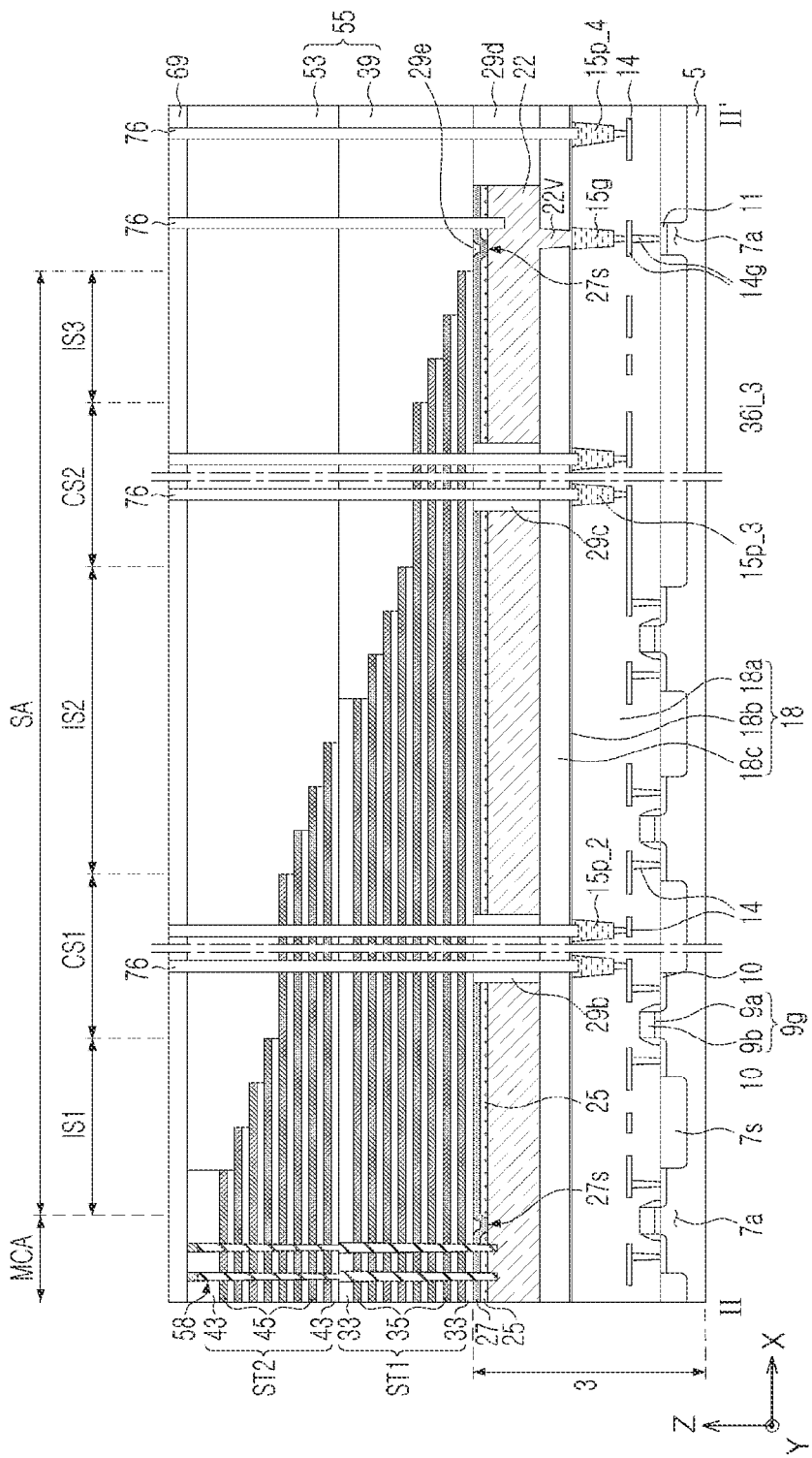
Figure 16C:
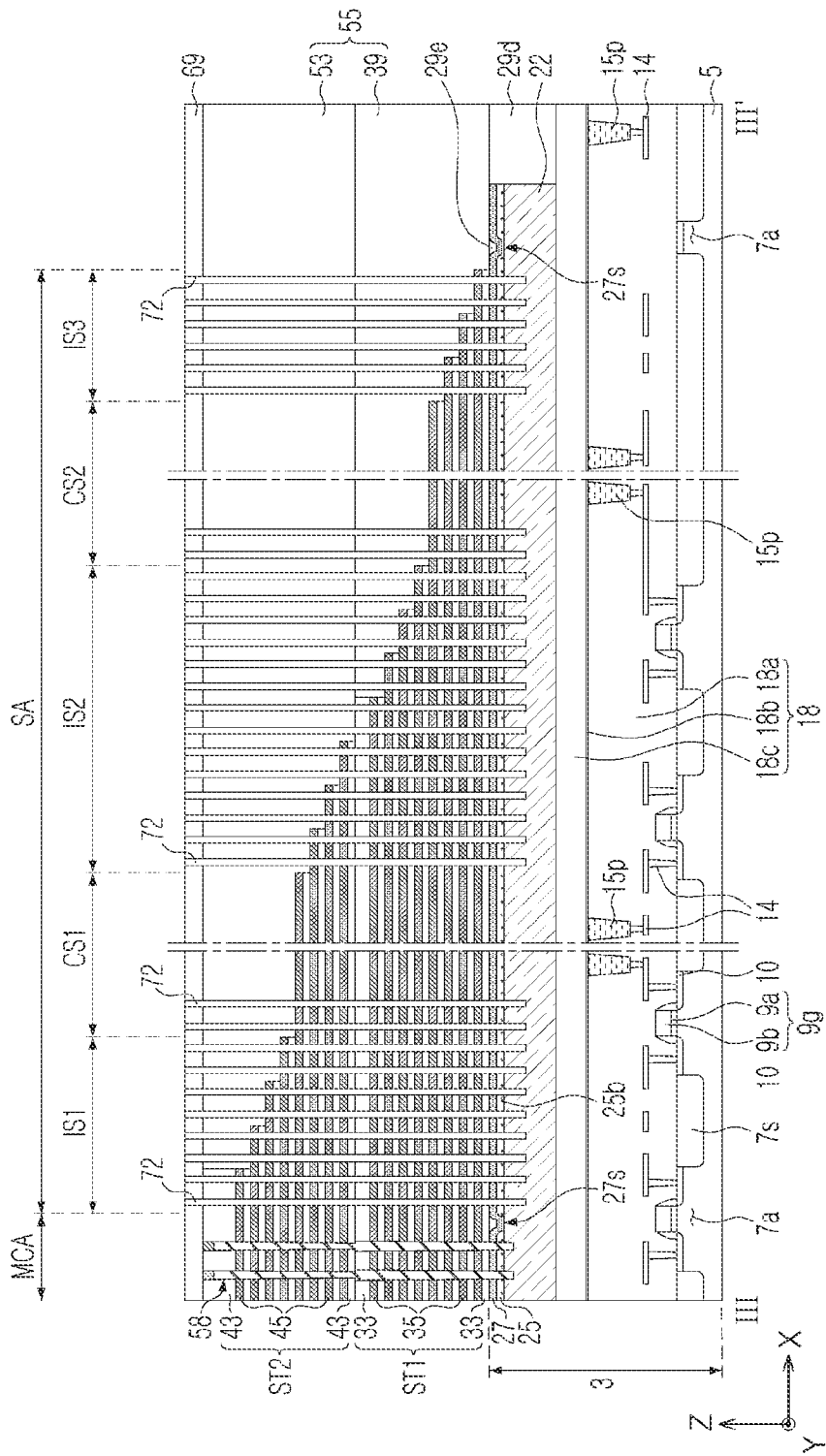
Figure 17A:
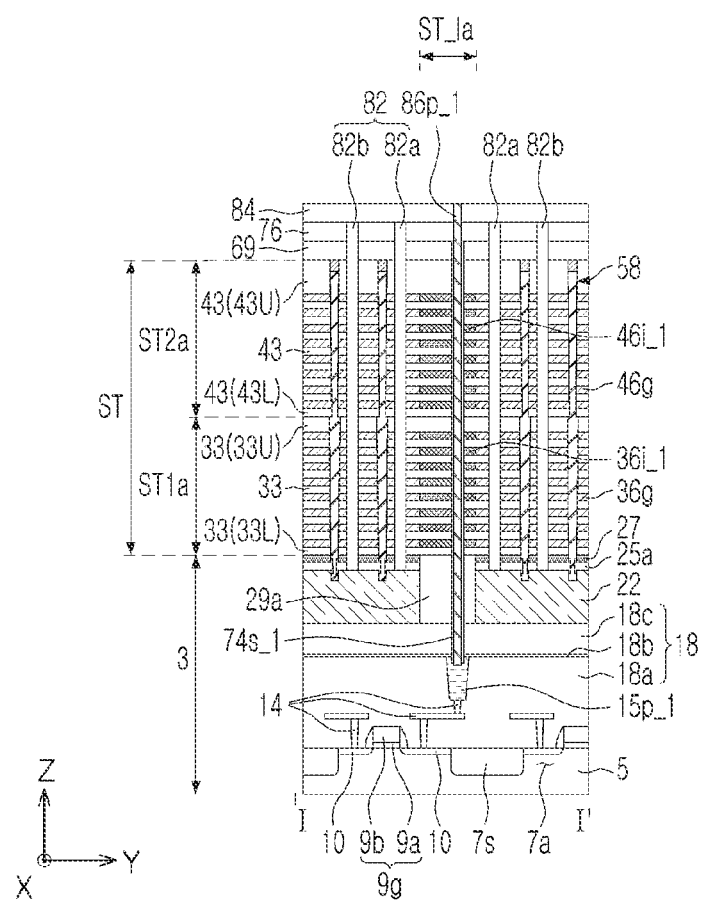

An example of a method of manufacturing a semiconductor device according to embodiments of the present disclosure will be described with reference to FIGS. 15A, 15B, 16A, 16B, 16C, 17A and 17B. Here, FIGS. 15A, 16A, and 17A are cross-sectional diagrams taken along line I-I' of FIG. 1, FIGS. 15B, 16B, and 17B are cross-sectional diagrams taken along line II-II' of FIG. 1, and FIG. 16C is a cross-sectional diagram taken along line III-III' of FIG. 1.

Figure 15A:
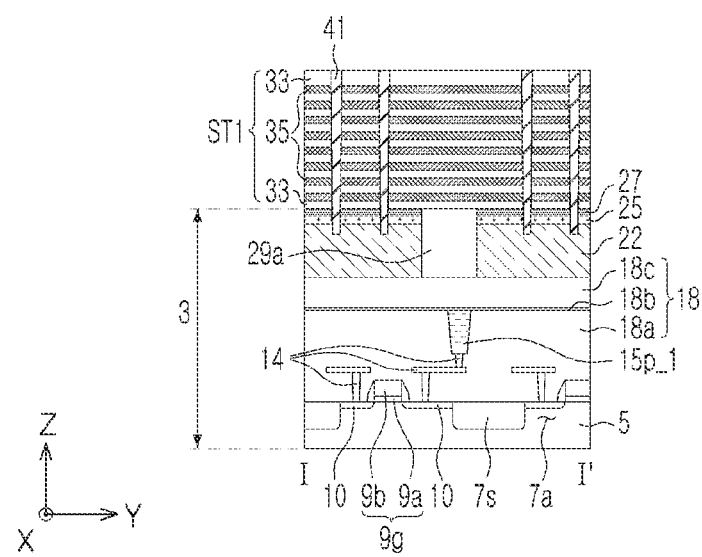
FIGS. 15A, 15B, 16A, 16B, 16C, 17A and 17B are respective and related cross-sectional diagrams illustrating in one example a method of manufacturing a semiconductor device according to embodiments of the present disclosure.
Figure 15B:
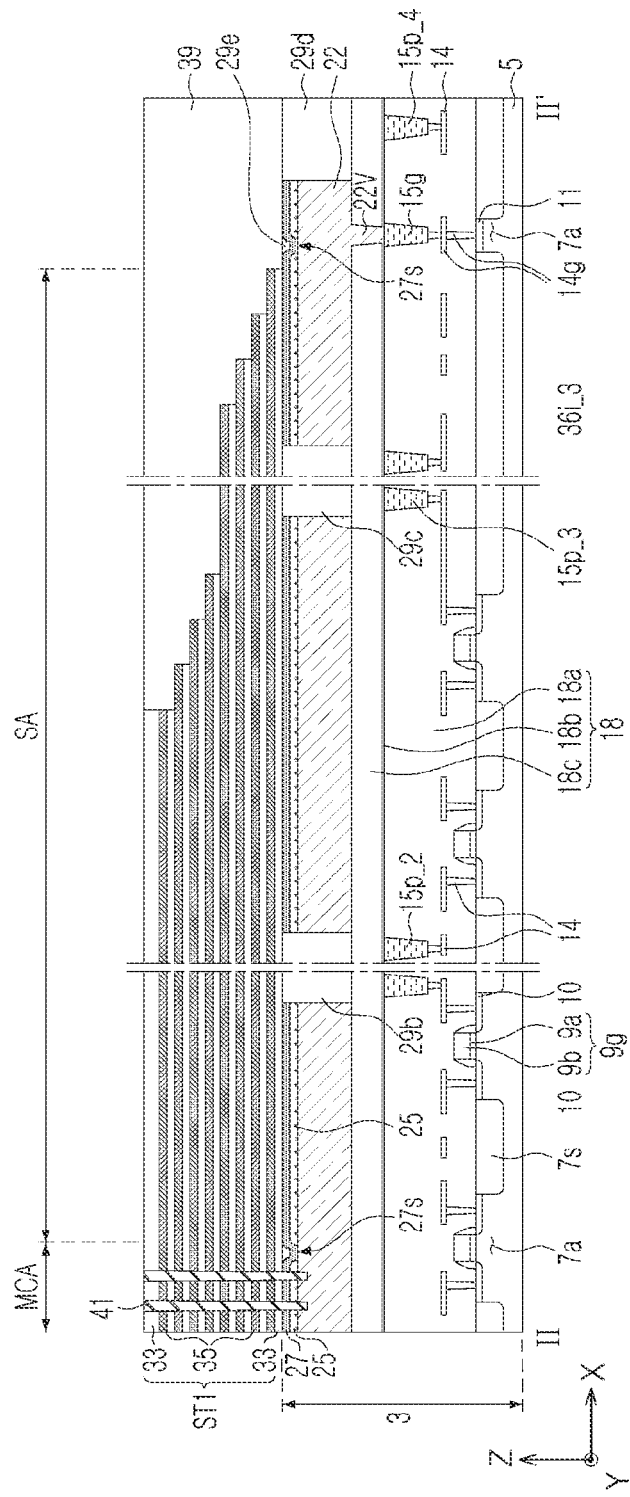

Referring to FIGS. 1, 15A, and 15B, the lower structure 3 may include the semiconductor substrate 5, the peripheral devices 9g and 10, the peripheral wiring structure 14, the pad patterns 15p, and the lower insulating structure 18 described with reference to FIGS. 1, 2A, 2B and 2C. The lower structure 3 may include a lower pattern layer 22 and an intermediate pattern layer 25 stacked in order on the lower insulating structure 18, and an upper pattern layer 278 penetrating a portion of the intermediate pattern layer 25 and contacting the lower pattern layer 22. The lower structure 3 may include the first, second and third gap-fill insulating layers 29a, 29b, and 29c and the outer insulating layer 29d as described with reference to FIGS. 1, 2A, 2B and 2C.

A lower mold stack structure ST1 may be formed on the lower structure 3. The lower mold stack structure ST1 may include lower interlayer insulating layers 33 and preliminary lower horizontal layers 35 alternately stacked. The lower mold stack structure ST1 in the staircase region SA may be patterned to form a staircase shape, and a lower capping insulating layer 39 covering the staircase portion of the lower mold stack structure ST1 may be formed.

A sacrificial vertical structure 41 penetrating the lower mold stack structure ST1 in the memory cell array region MCA may be formed.

Referring to FIGS. 1 and 16A, 16B and 16C, an upper mold stack structure ST2 including upper interlayer insulating layers 43 and preliminary upper horizontal layers 45 alternately stacked may be formed on the lower mold stack structure ST1. The upper mold stack structure ST2 in the staircase region may be patterned to form a staircase shape, and an upper capping insulating layer 53 covering the staircase shape of the upper mold stack structure ST2 and the lower capping insulating layer 39 may be formed. The capping insulating structure 55 may include the lower and upper capping insulating layers 39 and 53.

In the memory cell array region MCA, a memory vertical structure 58 penetrating the lower and upper mold stack structures ST1 and ST2 may be formed. While the memory vertical structure 58 is formed, the sacrificial vertical structure 41 may be removed. The memory vertical structure 58 may include the channel layer 62, the insulating core pattern 64, the data storage structure 60, and the pad pattern 66 described with reference to FIG. 3A. A first upper insulating layer 69 may be formed on the upper mold stack structure ST2 and the capping insulating structure 55.

Dummy vertical structures 72 penetrating the first upper insulating layer 69, the lower and upper mold stack structures ST1 and ST2, and the capping insulating structure 55 may be formed.

Insulating contact pillars 76 may be formed simultaneously with the dummy vertical structures 72. The insulating contact pillars 76 may be formed in positions in which the peripheral contact plugs 86p, the source contact plug 86s, the outer peripheral contact plug 86op, and the contact spacer layers 74s_1, 74s_2, 74s_3, 74s_s, and 74s_o, as described in FIGS. 1, 2A, 2B and 2C. Accordingly, a portion of the insulating contact pillars 76 may contact the pad patterns 15p, and another portion of the insulating contact pillars 76 may contact the lower pattern layer 22.

The forming the dummy vertical structures 72 and the insulating contact pillars 76 may include simultaneously forming holes penetrating the first upper insulating layer 69, the lower and upper mold stack structures ST1 and ST2, and the capping insulating structure 55 and exposing the lower pattern layer 22 and holes exposing the pad patterns 15p, and forming an insulating material simultaneously filling the holes.

Figure 17B:
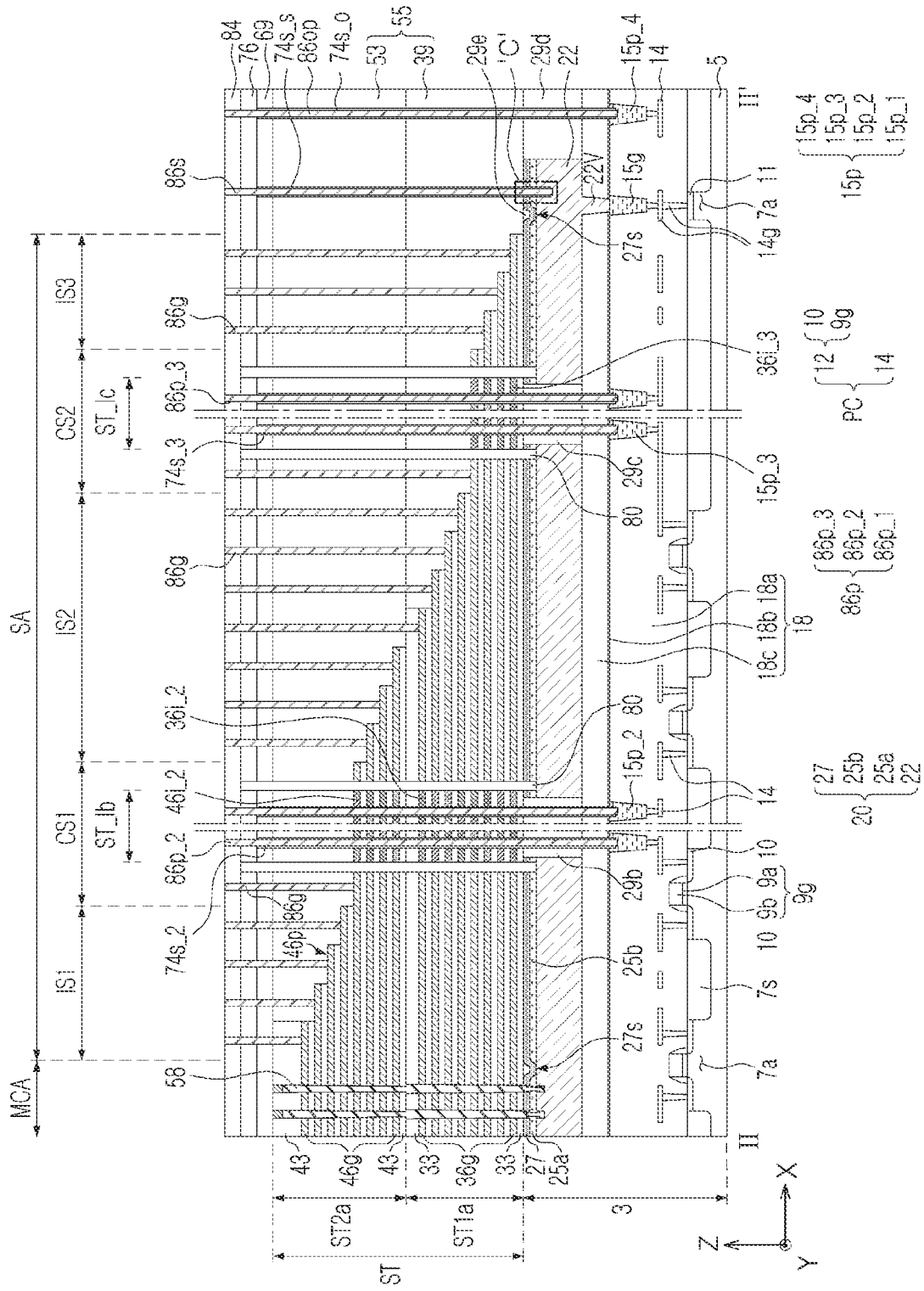

Referring to FIGS. 1, 17A, and 17B, a second upper insulating layer 76 may be formed on the first upper insulating layer 69. Additionally referring to FIGS. 16A, 16B and 16C, trenches penetrating the first and second upper insulating layers 69 and 76, the lower and upper mold stack structures ST1 and ST2, the upper pattern layer 27, and the intermediate pattern layer 25 may be formed, a portion of the trenches formed in the staircase region SA may be formed as a dam structure 80, the intermediate pattern layer exposed by the trenches disposed in the memory cell array region MCA may be substituted for the first intermediate pattern layer 25a described with reference to FIGS. 1, 2A, 2B and 2C. Additionally referring to FIGS. 6A, 6B and 6C, a portion of the preliminary lower and upper horizontal layers 35 and 45 exposed by the remaining trenches disposed in the memory cell array region MCA and the staircase region SA may be substituted for the gate horizontal layers 36g and 46g, a portion of the preliminary lower and upper horizontal layers 35 and 45 disposed in the memory cell array region MCA in the second direction may remain and may be formed as the first insulating region ST_Ia described with reference to FIGS. 1, 2A, 2B and 2C, and the preliminary lower and upper horizontal layers 35 and 45 surrounded by the dam structure 80 in the staircase region SA may be formed as first and second insulating regions ST_Ib and ST_Ic described with reference to FIGS. 1, 2A, 2B and 2C. Accordingly, the stack structure ST as described with reference to FIGS. 1, 2A, 2B and 2C may be formed.

A third upper insulating layer 84 may be formed on the second upper insulating layer 76. Subsequently, the peripheral contact plugs 86p, the source contact plug 86s, the outer peripheral contact plug 86op, and the gate contact plugs 86g as described with reference to FIGS. 1, 2A, 2B and 2C may be simultaneously formed. The forming the peripheral contact plugs 86p, the source contact plug 86s, the outer peripheral contact plug 86op, and the gate contact plugs 86g may include forming peripheral contact holes penetrating the third upper insulating layer 84, extending downwardly, and penetrating the insulating contact pillars 76 and gate contact holes penetrating the first, second and third upper insulating layers 69, 76 and 84 and the capping insulating structure 55, and forming a conductive material simultaneously filling the peripheral contact holes and the gate contact holes. The insulating contact pillars 76, the first, second and third upper insulating layers 69, 76, and 84, and the capping insulating structure 55 may be formed of the same material, such as silicon oxide, for example.

In some embodiments, the peripheral contact holes may be formed by etching the insulating contact pillars 76 instead of etching the insulating horizontal layers 36i and 46i which may be formed of silicon nitride. Accordingly, since the gate contact holes and the peripheral contact holes are formed by etching the same material, silicon oxide, for example, while the gate contact holes may be formed simultaneously with the peripheral contact holes, a punching defect in which the gate horizontal layers 36g and 46g are penetrated by the gate contact holes may be prevented.

Thereafter, a wiring process may be performed to form the bit line 93, the gate connection wirings 94, and the source connection wiring 95 described with reference to FIGS. 1, 2A, 2B and 2C.

In some embodiments, the peripheral contact plugs 86p, the source contact plug 86s, the outer peripheral contact plug 86op, and the gate contact plugs 86g may be simultaneously formed without defects. Therefore, a height of the semiconductor device may be reduced such that integration density and reliability of the semiconductor device may be improved, and productivity of the semiconductor device may be increased.

Figure 18:
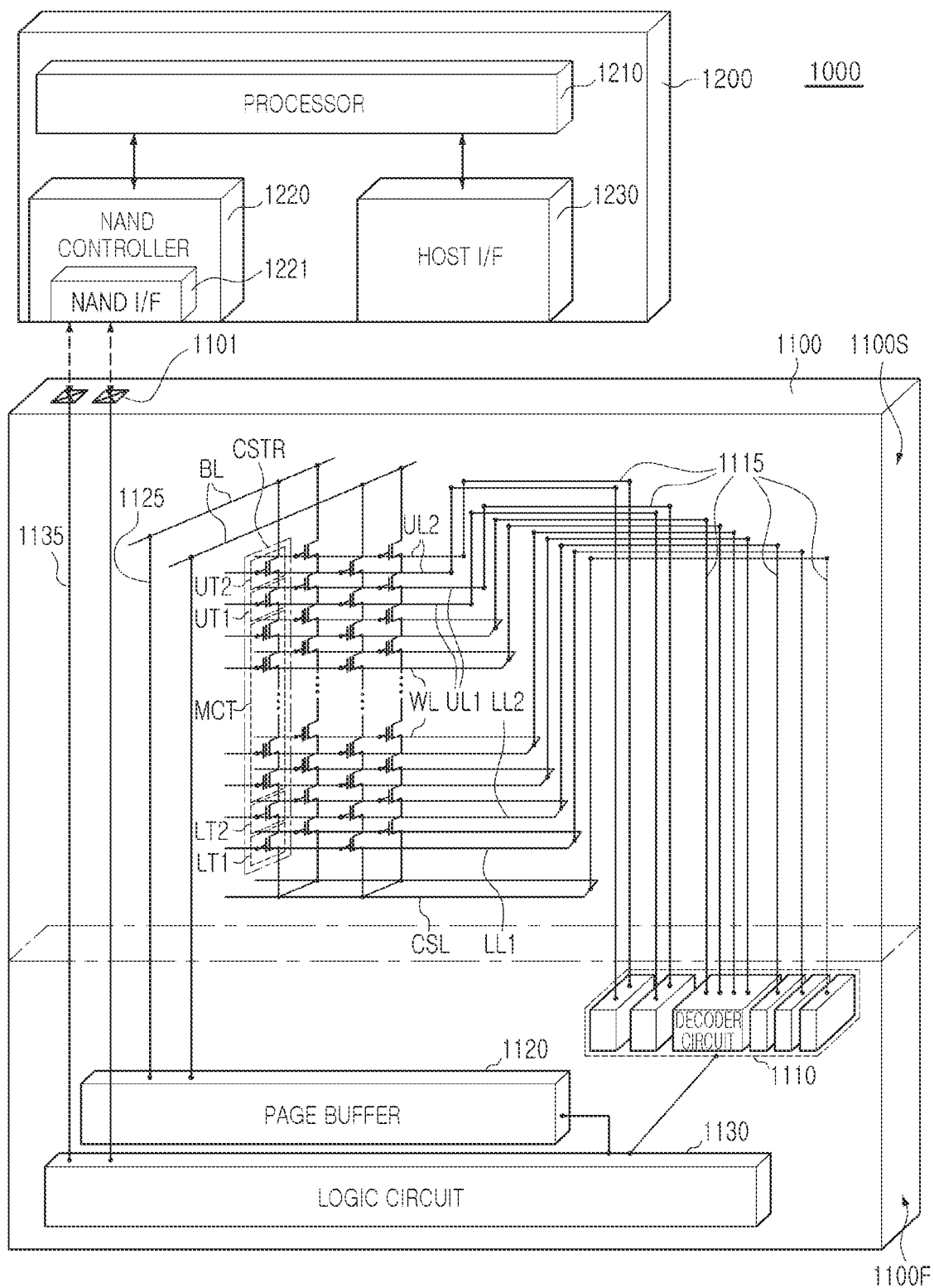
FIG. 18 is a conceptual diagram illustrating an electronic system including a semiconductor device according to embodiments of the present disclosure.

FIG. 18 is a conceptual diagram illustrating an electronic system including a semiconductor device according to embodiments of the present disclosure.

Referring to FIG. 18, an electronic system 1000 may include a semiconductor device 1100 and a controller 1200 electrically connected to the semiconductor device 1100. The electronic system 1000 may be implemented by a storage device including the semiconductor device 1100 or an electronic device including a storage device. The electronic system 1000 may be a data storage system. For example, the electronic system 1000 may be implemented by a solid state drive device (SSD) device, a universal serial bus (USB), a computing system, a medical device, or a communication device which may include the semiconductor device 1100.

The semiconductor device 1100 may be implemented by the semiconductor device described in the above-described embodiments with reference to FIGS. 1 to 14C. The semiconductor device 1100 may include a first structure 110F and a second structure 1100S on the first structure 110F. In embodiments, the first structure 110F may be disposed neighboring to the second structure 1100S. The first structure 110F may be a peripheral circuit structure including a decoder circuit 1110, a page buffer 1120, and a logic circuit 1130. For example, the first structure 110F may include the peripheral circuit PC, the peripheral wiring structure 14, and the pad patterns 15p of the lower structure 3 described above.

The second structure 1100S may be configured as a memory cell structure including a bit line BL, a common source line CSL, word lines WL, first and second gate upper lines UL1 and UL2, first and second gate lower lines LL1 and LL2, and memory cell strings CSTR disposed between the bit line BL and the common source line CSL.

The pattern structure 20 described above may include a silicon layer having N-type conductivity, and the silicon layer having N-type conductivity may be the common source line CSL.

In the second structure 1100S, each of the memory cell strings CSTR may include lower transistors LT1 and LT2 adjacent to the common source line CSL, upper transistors UT1 and UT2 adjacent to the bit line BL, and a plurality of memory cell transistors MCT disposed between the lower transistors LT1 and LT2 and the upper transistors UT1 and UT2. The number of the lower transistors LT1 and LT2 and the number of the upper transistors UT1 and UT2 may be varied in embodiments.

In embodiments, the upper transistors UT1 and UT2 may include a string select transistor, and the lower transistors LT1 and LT2 may include a ground select transistor. The lower gate lines LL1 and LL2 may be gate electrodes of lower transistors LT1 and LT2. The word lines WL may be gate electrodes of memory cell transistors MCT, and the gate upper lines UL1 and UL2 may be gate electrodes of upper transistors UT1 and UT2, respectively.

The gate horizontal layers 36g and 46g described above may form the lower gate lines LL1 and LL2, the word lines WL, and the upper gate lines UL1 and UL2. For example, the first and second lower gate horizontal layers 36g_La and 36Lb as in FIG. 3A may form the lower gate lines LL1 and LL2, and the intermediate gate horizontal layers 36M and 46M may form the word lines WL, and the first and second upper gate horizontal layers 46g_Ua and 46g_Ub may form the gate upper lines UL1 and UL2.

In embodiments, the lower transistors LT1 and LT2 may include a lower erase control transistor LT1 and a ground select transistor LT2 connected to each other in series. The upper transistors UT1 and UT2 may include a string select transistor UT1 and an upper erase control transistor UT2 connected to each other in series. At least one of the lower erase control transistor LT1 and the upper erase control transistor UT1 may be used to an erase operation for erasing data stored in the memory cell transistors MCT using a gate induced leakage current (GIDL) phenomenon.

The common source line CSL, the first and second gate lower lines LL1 and LL2, word lines WL, and the first and second gate upper lines UL1 and UL2 may be electrically connected to the decoder circuit 1110 through first connection wirings 1115 extending to the second structure 1100S in the first structure 110F.

The first connection wirings 1115 may include the gate contact plugs 86g, the gate connection wirings 94 and the peripheral contact plugs 86p described above.

The bit lines BL may be electrically connected to the page buffer 1120 through the second connection wirings 1125 extending to the second structure 1100S in the first structure 110F.

In the first structure 110F, the decoder circuit 1110 and the page buffer 1120 may perform a control operation on at least one of the selected memory cell transistors of the plurality of memory cell transistors MCT. The decoder circuit 1110 and the page buffer 1120 may be controlled by a logic circuit 1130. The semiconductor device 1000 may communicate with the controller 1200 through the input/output pad 1101 electrically connected to the logic circuit 1130. The input/output pad 1101 may be electrically connected to the logic circuit 1130 through an input/output connection line 1135 extending to the second structure 1100S in the first structure 110F.

The controller 1200 may include a processor 1210, a NAND controller 1220, and a host interface 1230. In embodiments, the electronic system 1000 may include a plurality of semiconductor devices 1100, and in this case, the controller 1200 may control the plurality of semiconductor devices 1100.

The processor 1210 may control overall operation of the electronic system 1000 including the controller 1200. The processor 1210 may operate according to a predetermined firmware, and may access the semiconductor device 1100 by controlling the NAND controller 1220. The NAND controller 1220 may include a NAND interface 1221 for processing communication with the semiconductor device 1100. Through the NAND interface 1221, a control command for controlling the semiconductor device 1100, data to be written in the memory cell transistors MCT of the semiconductor device 1100, and data to be read from the memory cell transistors MCT of the semiconductor device 1100 may be transmitted. The host interface 1230 may provide a communication function between the electronic system 1000 and an external host. When a control command is received from an external host through the host interface 1230, the processor 1210 may control the semiconductor device 1100 in response to the control command.

Figure 19:
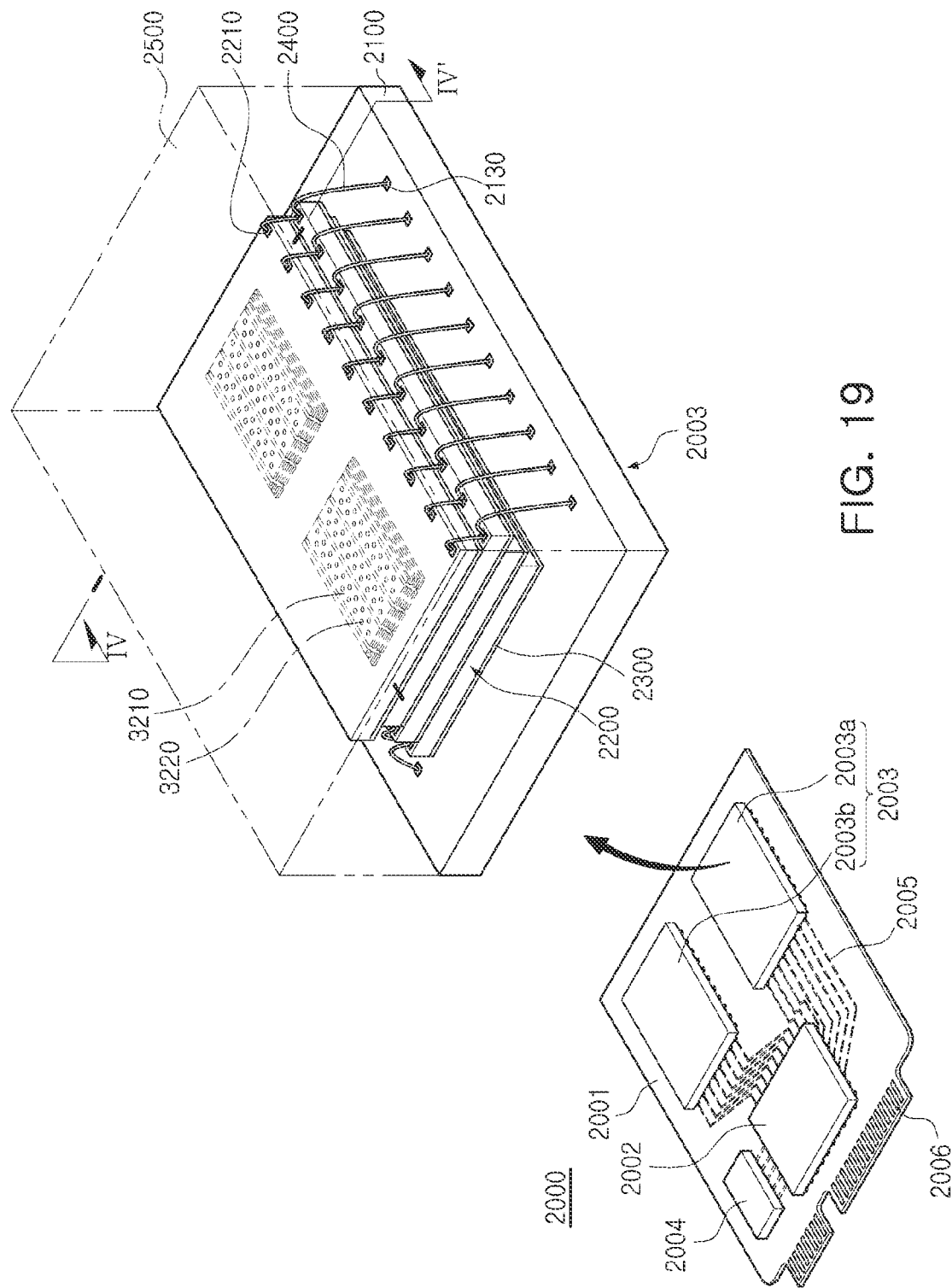
FIG. 19 is a perspective diagram illustrating an electronic system including a semiconductor device according to embodiments of the present disclosure.

FIG. 19 is a perspective diagram illustrating an electronic system including a semiconductor device according to an embodiment of the present disclosure.

Referring to FIG. 19, an electronic system 2000 may include a main substrate 2001, a controller 2002 mounted on the main substrate 2001, one or more semiconductor packages 2003, and a DRAM 2004. The semiconductor package 2003 and the DRAM 2004 may be connected to the controller 2002 by wiring patterns 2005 formed on the main substrate 2001.

The main substrate 2001 may include a connector 2006 including a plurality of pins coupled to an external host. The number and arrangement of the plurality of pins in the connector 2006 may vary according to a communication interface between the electronic system 2000 and the external host. In embodiments, the electronic system 2000 may communicate with an external host through one of universal serial bus (USB), peripheral component interconnect express (PCI-Express), serial advanced technology attachment (SATA), M-Phy for universal flash storage (UFS), or the like. In embodiments, the electronic system 2000 may operate by power supplied from an external host through the connector 2006. The electronic system 2000 may further include a power management integrated circuit (PMIC) which may distribute power supplied from the external host to the controller 2002 and the semiconductor package 2003.

The controller 2002 may write data in the semiconductor package 2003 or may read data from the semiconductor package 2003, and may improve an operation speed of the electronic system 2000.

The DRAM 2004 may be configured as a buffer memory for reducing a speed difference between the semiconductor package 2003, which is a data storage space, and an external host. The DRAM 2004 included in the electronic system 2000 may also operate as a type of cache memory, and may provide a space for temporarily storing data in a control operation on the semiconductor package 2003. When the DRAM 2004 is included in the electronic system 2000, the controller 2002 may further include a DRAM controller for controlling the DRAM 2004 in addition to a NAND controller for controlling the semiconductor package 2003.

The semiconductor package 2003 may include first and second semiconductor packages 2003a and 2003b spaced apart from each other. Each of the first and second semiconductor packages 2003a and 2003b may be configured as a semiconductor package including a plurality of semiconductor chips 2200. Each of the semiconductor chips 2200 may include a semiconductor device described in the above-described embodiments with reference to FIGS. 1 to 14C.

Each of the first and second semiconductor packages 2003a and 2003b may include a package substrate 2100, a semiconductor chips 2200 on the package substrate 2100, adhesive layers 2300 disposed on a lower surface of each of the semiconductor chips 2200, a connection structure 2400 electrically connecting the semiconductor chips 2200 to the package substrate 2100, and a molding layer 2500 covering the semiconductor chips 2200 and the connection structure 2400 on the package substrate 2100.

The package substrate 2100 may be configured as a printed circuit board including package upper pads 2130. Each of the semiconductor chips 2200 may include an input/output pad 2210. The input/output pad 2210 may be the input/output pad 1101 of FIG. 18.

In embodiments, the connection structure 2400 may be a bonding wire electrically connecting the input/output pad 2210 to the package upper pads 2130. Accordingly, in each of the first and second semiconductor packages 2003a and 2003b, the semiconductor chips 2200 may be electrically connected to each other by a bonding wire method, and may be electrically connected to the package upper pads 2130 of the package substrate 2100. In embodiments, in each of the first and second semiconductor packages 2003a and 2003b, the semiconductor chips 2200 may be electrically connected to each other by a connection structure including a through silicon via (TSV), instead of the connection structure 2400 of a bonding wire method.

In embodiments, the controller 2002 and the semiconductor chips 2200 may be included in a single package. For example, the controller 2002 and the semiconductor chips 2200 may be mounted on an interposer substrate different from the main substrate 2001, and the controller 2002 and the semiconductor chips 2200 may be connected to the controller 2002 by wiring formed on the interposer substrate.

Figure 20:
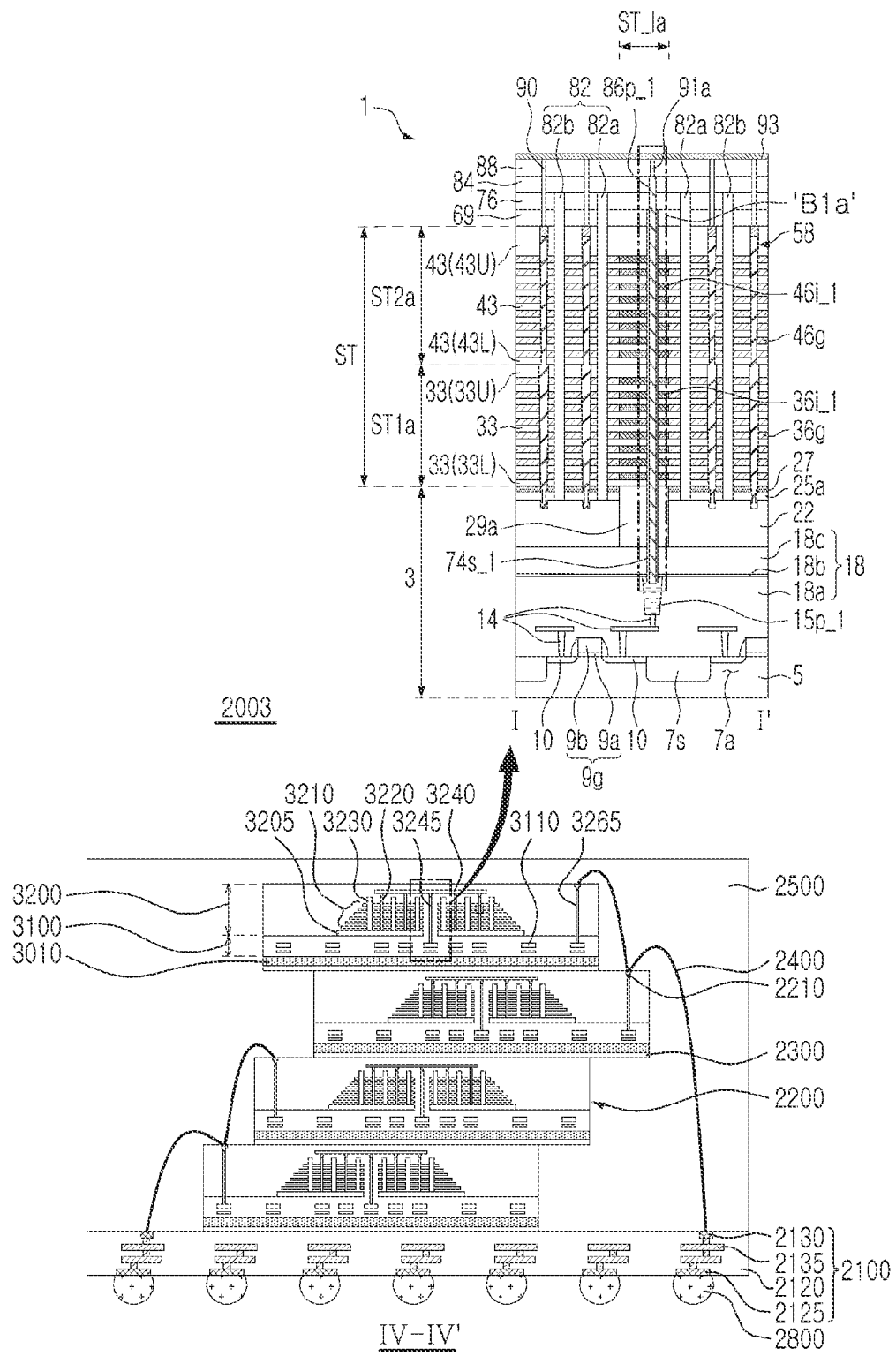
FIG. 20 is a cross-sectional diagram illustrating an electronic system including a semiconductor device according to embodiments of the present disclosure.

FIG. 20 is a cross-sectional diagram further illustrating an electronic system including a semiconductor device according to an embodiment of the present disclosure. Here, the semiconductor package 2003 of FIG. 20 is taken along line IV-IV' in FIG. 19.

Referring to FIG. 20, in the semiconductor package 2003, the package substrate 2100 may be configured as a printed circuit board. The package substrate 2100 may include a package substrate body portion 2120, package upper pads 2130 disposed on the upper surface of the package substrate body portion 2120, lower pads 2125 disposed on a lower surface of the package substrate body portion 2120 or exposed through a lower surface, and internal wirings 2135 electrically connecting the package upper pads 2130 to the lower pads 2125 in the package substrate body portion 2120. The package upper pads 2130 may be electrically connected to the connection structures 2400. The lower pads 2125 may be connected to the wiring patterns 2005 of the main substrate 2010 of the electronic system 2000 through the conductive connection portions 2800 as illustrated in FIG. 19.

Each of the semiconductor chips 2200 may include a semiconductor substrate 3010, and a first structure 3100 and a second structure 3200 stacked in order on the semiconductor substrate 3010. The first structure 3100 may include a peripheral circuit region including peripheral wirings 3110. The second structure 3200 may include a common source line 3205, a gate stack structure 3210 on the common source line 3205, memory channel structures 3220 and separation structures 3230 penetrating the gate stack structure 3210, bit lines 3240 electrically connected to the memory channel structures 3220, and gate connection wirings 94 (e.g., in FIG. 2B) electrically connected to the word lines WL (e.g., in FIG. 18) of the gate stack structure 3210. The first structure 3100 may include the first structure 1100F of FIG. 18, and the second structure 3200 may include the second structure illustrated 1100S of FIG. 18. For example, in FIG. 20, an enlarged portion indicated by reference numeral 1 may represent the cross-sectional structure of the example illustrated in FIG. 2B.

Accordingly, each of the semiconductor chips 2200 may include the semiconductor device 1 described in the aforementioned embodiments described with reference to the foregoing drawings.

Each of the semiconductor chips 2200 may include a through wiring 3245 electrically connected to the peripheral wirings 3110 of the first structure 3100 and extending into the second structure 3200. The through wiring 3245 may penetrate the gate stack structure 3210 and may be further disposed on an external side of the gate stack structure 3210. The through wiring 3245 may be the peripheral contact plugs 86p described in one of the aforementioned embodiments described with reference to the foregoing drawings.

Each of the semiconductor chips 2200 may further include an input/output pad 2210 electrically connected to peripheral wirings 3110 of the first structure 3100 and electrically connected to an input/output connection wiring 3265 and an input/output connection wiring 3265 extending into the second structure 3200.

According to the foregoing embodiments, a semiconductor device (and accordingly, an incorporating electronic device) may have greater integration density and improved reliability.

While the embodiments have been shown and described above, it will be apparent to those skilled in the art that modifications and variations could be made without departing from the scope of the present disclosure as defined by the appended claims.

What is claimed is:
1. A semiconductor device, comprising:
a lower structure including a peripheral circuit, a lower insulating structure covering the peripheral circuit, and a pattern structure on the lower insulating structure;
a stack structure including interlayer insulating layers and horizontal layers alternately stacked on the lower structure, wherein the horizontal layers include gate horizontal layers disposed in a gate region of the stack structure and first insulating horizontal layers disposed in a first insulating region of the stack structure;
a memory vertical structure including a portion penetrating the gate horizontal layers in a vertical direction;
dummy vertical structures including a portion penetrating the gate horizontal layers in the vertical direction and spaced apart from the memory vertical structure;

a first peripheral contact plug including a portion penetrating the first insulating region in the vertical direction; and gate contact plugs disposed on gate pads of the gate horizontal layers, wherein the gate contact plugs and the first peripheral contact plugs have upper surfaces disposed at the same level, the memory vertical structure includes a first material different from a material of the dummy vertical structures, the memory vertical structure and the dummy vertical structure contact the pattern structure, at least one of the dummy vertical structures extends further downwardly into the pattern structure than the memory vertical structure from the upper surface of the pattern structure the lower structure further includes a pad pattern in the lower insulating structure and a gap-fill insulating layer penetrating the pattern structure and overlapping the pad pattern, the first peripheral contact plug extends downwardly from a portion penetrating the first insulating region to penetrate the gap-fill insulating layer and contact the pad pattern, the lower insulating structure includes a first lower insulating layer at least partially surrounding a side surface of the pad pattern, an etch stop layer on the first lower insulating layer and the pad pattern, and a second lower insulating layer on the etch stop layer, the etch stop layer includes a material different from a material of the second lower insulating layer, a thickness of the etch stop layer is less than a thickness of the second lower insulating layer, and a portion of the first peripheral contact plug penetrates the second lower insulating layer and the etch stop layer to contact the pad pattern.

2. The semiconductor device of claim 1, wherein the first peripheral contact plug extends further downwardly from the upper surface of the pad pattern into the pad pattern, and a vertical height of the first peripheral contact plug extending from the upper surface of the pad pattern into the pad pattern is greater than a thickness of the etch stop layer.

3. The semiconductor device of claim 1, further comprising:

an insulating contact spacer layer covering at least a portion of a side surface of the first peripheral contact plug, wherein the insulating contact spacer layer contacts the pad pattern, and a lower end of the insulating contact spacer layer is at a higher level than a lower end of the first peripheral contact plug.

4. The semiconductor device of claim 1, wherein the stack structure includes a lower stack structure and an upper stack structure on the lower stack structure, at least a portion of a side surface of the memory vertical structure includes a bent portion at a level between an uppermost gate horizontal layer of the gate horizontal layers of the lower stack structure and a lowermost gate horizontal layer of the gate horizontal layers of the upper stack structure, the memory vertical structure includes an insulating core pattern, a channel layer covering a side surface and a bottom surface of the insulating core pattern, and a data storage structure disposed on an external surface of the channel layer, and the first material of the memory vertical structure is a material of the channel layer.

5. The semiconductor device of claim 1, wherein the first peripheral contact plug includes a lower plug portion and an upper plug portion on the lower plug portion, the upper plug portion has a width greater than a width of the lower plug portion, and in the first peripheral contact plug, a side surface of the lower plug portion is bent in a direction away from a central axis of the lower plug portion and extends to a side surface of the upper plug portion.

6. The semiconductor device of claim 5, wherein the upper plug portion includes a portion contacting the lower plug portion and a portion overlapping the first insulating horizontal layers.

7. The semiconductor device of claim 5, wherein a first central axis of the lower plug portion and a second central axis of the upper plug portion are misaligned.

8. The semiconductor device of claim 1, wherein the lower structure further includes a buffer pad pattern disposed on the pad pattern, and wherein the gap-fill insulating layer is disposed on the buffer pad pattern, an upper surface of the buffer pad pattern is at a same level of at least one of a level of the upper surface of the lower insulating structure, and a level higher than a level of the lower surface of the pattern structure, the first peripheral contact plug extends downwardly from the portion penetrating the first insulating region to contact the buffer pad pattern, and the portion of the first peripheral contact plug extends into the buffer pad pattern.

9. The semiconductor device of claim 1, further comprising:

a bit line electrically connected to the memory vertical structure on the memory vertical structure; and a gate connection wiring electrically connected to the first peripheral contact plug and one of the gate contact plugs on the gate contact plugs and the first peripheral contact plug.

10. The semiconductor device of claim 1, further comprising:

an insulating contact spacer layer disposed on at least a portion of a side surface of the first peripheral contact plug, and the insulating contact spacer layer includes a spacer portion interposed between the first peripheral contact plug and the first insulating horizontal layers.

11. The semiconductor device of claim 10, wherein the first peripheral contact plug has a first plug side surface and a second plug side surface opposing the first plug side, at least one of the first insulating horizontal layers includes a first horizontal portion facing the first plug side surface and a second horizontal portion facing the second plug side surface, the insulating contact spacer layer includes a first spacer portion interposed between the first plug side surface and the first horizontal portion and a second spacer portion interposed between the second plug side surface and the second horizontal portion, and a thickness of the first spacer portion is greater than a thickness of the second spacer portion.

12. The semiconductor device of claim 1, further comprising:

a second peripheral contact plug, wherein the stack structure further includes a second insulating region spaced apart from the first insulating region, the horizontal layers further include second insulating horizontal layers disposed in the second insulating region, the second peripheral contact plug includes a portion penetrating the second insulating region in the vertical direction, and an uppermost first insulating horizontal layer of the first insulating horizontal layers is disposed at a level different from a level of an uppermost second insulating horizontal layer of the second insulating horizontal layers.

13. A semiconductor device, comprising:

a lower structure including a peripheral circuit, a lower insulating structure covering the peripheral circuit, a pattern structure on the lower insulating structure, a pad pattern in the lower insulating structure and electrically connected to the peripheral circuit, and a gap-fill insulating layer penetrating the pattern structure and overlapping the pad pattern;

a stack structure including interlayer insulating layers and horizontal layers alternately stacked on the lower structure, where the stack structure extends from a memory cell array region to a staircase region adjacent to the memory cell array region, the stack structure includes a gate region and an insulating region, and a side surface of the insulating region is at least partially surrounded by the gate region in the staircase region, and the horizontal layers include gate horizontal layers disposed in the gate region and insulating horizontal layers disposed in the insulating region;

a memory vertical structure including a portion penetrating the gate horizontal layers in a vertical direction in the memory cell array region;

dummy vertical structures including a portion penetrating the gate horizontal layers in the vertical direction in the staircase region;

a peripheral contact plug contacting the pad pattern, extending in the vertical direction, and penetrating the insulating region; and gate contact plugs disposed on the gate pads of the gate horizontal layers in the staircase region, wherein the gate contact plugs and the peripheral contact plugs have upper surfaces disposed at the same level, the stack structure includes a first staircase region and a second staircase region arranged in a first direction away from the memory cell array region, and a staircase connection region disposed between the first staircase region and the second staircase region in the staircase region, each of the first and second staircase regions includes a staircase shape extending downwardly by a first height difference in the first direction, an upper surface of the staircase connection region has a shape that is at least one of flattened in the first direction, and having a height difference less than the first height difference in the first direction, a portion of the staircase connection region is the insulating region, the peripheral contact plug extends downwardly from a portion penetrating the insulating region to penetrate the gap-fill insulating layer, the lower insulating structure further includes a first lower insulating layer at least partially surrounding a side surface of the pad pattern, an etch stop layer on the first lower insulating layer and the pad pattern, and a second lower insulating layer on the etch stop layer, the etch stop layer includes a material different from a material of the second lower insulating layer, a thickness of the etch stop layer is less than a thickness of the second lower insulating layer, a portion of the peripheral contact plug penetrates the second lower insulating layer and the etch stop layer to contact the pad pattern, and the memory vertical structure includes a material different from a material of the dummy vertical structures.

14. The semiconductor device of claim 13, further comprising:

an insulating contact spacer layer covering at least a portion of a side surface of the peripheral contact plug, wherein the insulating contact spacer layer contacts the pad pattern, and a lower end of the insulating contact spacer layer is at a higher level than a lower end of the peripheral contact plug.

15. The semiconductor device of claim 13, wherein the peripheral contact plug includes a lower plug portion and an upper plug portion on the lower plug portion, the upper plug portion has a width greater than a width of the lower plug portion, and a first central axis of the lower plug portion and a second central axis of the upper plug portion are misaligned.

16. An electronic system, comprising a main substrate, a semiconductor device on the main substrate and a controller electrically connected to the semiconductor device on the main substrate, wherein the semiconductor device includes:

a lower structure including a peripheral circuit, a lower insulating structure covering the peripheral circuit, and a pattern structure on the lower insulating structure;

a stack structure including interlayer insulating layers and horizontal layers alternately stacked on the lower structure, wherein the horizontal layers include gate horizontal layers disposed in the gate region of the stack structure and insulating horizontal layers disposed in the insulating region of the stack structure;

a memory vertical structure including a portion penetrating the gate horizontal layers in a vertical direction;

dummy vertical structures including a portion penetrating the gate horizontal layers in the vertical direction and spaced apart from the memory vertical structure;

a peripheral contact plug including a portion penetrating the insulating region in the vertical direction; and gate contact plugs disposed on gate pads of the gate horizontal layers, wherein the gate contact plugs and the peripheral contact plugs have upper surfaces disposed at the same level, each of the dummy vertical structures has a width greater than a width of each of the memory vertical structures at the same level, the memory vertical structure includes a material different from a material of the dummy vertical structures, the memory vertical structure and the dummy vertical structure extend downwardly from an upper surface of the pattern structure into the pattern structure to contact the pattern structure, at least one of the dummy vertical structures extends downwardly further into the pattern structure than the memory vertical structure from the upper surface of the pattern structure, the lower structure further includes a pad pattern in the lower insulating structure and a gap-fill insulating layer penetrating the pattern structure and overlapping the pad pattern, the peripheral contact plug extends downwardly to penetrate the gap-fill insulating layer and contact the pad pattern, the lower insulating structure further includes a first lower insulating layer at least partially surrounding a side surface of the pad pattern, an etch stop layer on the first lower insulating layer and the pad pattern, and a second lower insulating layer on the etch stop layer, the etch stop layer includes a material different from a material of the second lower insulating layer, a thickness of the etch stop layer is less than a thickness of the second lower insulating layer, and a portion of the first peripheral contact plug penetrates the second lower insulating layer and the etch stop layer to contact the pad pattern.

17. The electronic system of claim 16, further comprising:
an insulating contact spacer layer covering at least a portion of a side surface of the peripheral contact plug, wherein the pattern structure further includes a silicon layer, the insulating contact spacer layer contacts the pad pattern, and a lower end of the insulating contact spacer layer is at a higher level than a lower end of the peripheral contact plug.

18. The electronic system of claim 16, wherein the peripheral contact plug includes a lower plug portion and an upper plug portion on the lower plug portion,
the upper plug portion has a width greater than a width of the lower plug portion, and
a first central axis of the lower plug portion and a second central axis of the upper plug portion are misaligned.

* * * * *